(12) United States Patent
Xi et al.

(10) Patent No.: US 7,867,914 B2
(45) Date of Patent: Jan. 11, 2011

(54) SYSTEM AND METHOD FOR FORMING AN INTEGRATED BARRIER LAYER

(75) Inventors: Ming Xi, Palo Alto, CA (US); Michael Yang, Palo Alto, CA (US); Hui Zhang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 620 days.

(21) Appl. No.: 11/770,735

(22) Filed: Jun. 29, 2007

(65) Prior Publication Data

US 2008/0014352 A1    Jan. 17, 2008

Related U.S. Application Data

(63) Continuation of application No. 10/414,271, filed on Apr. 15, 2003, now Pat. No. 7,279,432.

(60) Provisional application No. 60/386,221, filed on Apr. 16, 2002.

(51) Int. Cl.
*H01L 21/44* (2006.01)
*H01L 21/469* (2006.01)

(52) U.S. Cl. .................. 438/763; 438/680; 438/685; 438/762; 257/E21.17

(58) Field of Classification Search .............. 438/680, 438/685, 761, 762, 763
See application file for complete search history.

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | 118/725 |
| 4,413,022 A | 11/1983 | Suntola et al. | 427/255.2 |
| 4,486,487 A | 12/1984 | Skarp | 428/216 |
| 4,767,494 A | 8/1988 | Kobayashi et al. | |
| 4,806,321 A | 2/1989 | Nishizawa et al. | |
| 4,813,846 A | 3/1989 | Helms et al. | |
| 4,829,022 A | 5/1989 | Kobayashi et al. | |
| 4,834,831 A | 5/1989 | Nishizawa et al. | |
| 4,838,983 A | 6/1989 | Schumaker et al. | |
| 4,838,993 A | 6/1989 | Aoki et al. | |

(Continued)

FOREIGN PATENT DOCUMENTS

DE    19627017    1/1997

(Continued)

OTHER PUBLICATIONS

Klaus, et al. "Atomically Controlled Growth of Tungsten and Tungsten Nitride Using Sequential Surface Reactions," Applied Surface Science, 162-163 (2000) 479-491.

(Continued)

*Primary Examiner*—Alexander G Ghyka
(74) *Attorney, Agent, or Firm*—Patterson & Sheridan, LLP

(57) ABSTRACT

An apparatus and method for forming an integrated barrier layer on a substrate is described. The integrated barrier layer comprises at least a first refractory metal layer and a second refractory metal layer. The integrated barrier layer is formed using a dual-mode deposition process comprising a chemical vapor deposition (CVD) step and a cyclical deposition step. The dual-mode deposition process may be performed in a single process chamber.

3 Claims, 12 Drawing Sheets

U.S. PATENT DOCUMENTS

| | | |
|---|---|---|
| 4,840,921 A | 6/1989 | Matsumoto |
| 4,845,049 A | 7/1989 | Sunakawa et al. |
| 4,859,307 A | 8/1989 | Nishizawa et al. |
| 4,859,627 A | 8/1989 | Sunakawa et al. |
| 4,861,417 A | 8/1989 | Mochizuki et al. |
| 4,876,218 A | 10/1989 | Pessa et al. |
| 4,892,751 A | 1/1990 | Miyake et al. |
| 4,917,556 A | 4/1990 | Stark et al. |
| 4,927,670 A | 5/1990 | Erbil |
| 4,931,132 A | 6/1990 | Aspnes et al. |
| 4,951,601 A | 8/1990 | Maydan et al. |
| 4,960,720 A | 10/1990 | Shimbo et al. |
| 4,975,252 A | 12/1990 | Nishizawa et al. |
| 4,976,839 A | 12/1990 | Inoue et al. |
| 4,976,996 A | 12/1990 | Monkowski et al. |
| 4,993,357 A | 2/1991 | Scholz et al. |
| 5,000,113 A | 3/1991 | Wang et al. |
| 5,013,683 A | 5/1991 | Petroff et al. |
| 5,028,565 A | 7/1991 | Chang et al. |
| 5,082,798 A | 1/1992 | Arimoto et al. |
| 5,085,885 A | 2/1992 | Foley et al. |
| 5,091,320 A | 2/1992 | Aspnes et al. |
| 5,130,269 A | 7/1992 | Kitahara et al. |
| 5,166,092 A | 11/1992 | Mochizuki et al. |
| 5,173,474 A | 12/1992 | Connell et al. |
| 5,186,718 A | 2/1993 | Tepman et al. |
| 5,205,077 A | 4/1993 | Wittstock et al. |
| 5,225,366 A | 7/1993 | Yoder |
| 5,227,335 A | 7/1993 | Holschwandner et al. |
| 5,234,561 A | 8/1993 | Randhawa et al. |
| 5,246,536 A | 9/1993 | Nishizawa et al. |
| 5,250,148 A | 10/1993 | Nishizawa et al. |
| 5,254,207 A | 10/1993 | Nishizawa et al. |
| 5,256,244 A | 10/1993 | Ackerman |
| 5,259,881 A | 11/1993 | Edwards et al. |
| 5,270,247 A | 12/1993 | Sakuma et al. |
| 5,278,435 A | 1/1994 | Van Hove et al. |
| 5,281,274 A | 1/1994 | Yoder |
| 5,286,296 A | 2/1994 | Sato et al. |
| 5,290,748 A | 3/1994 | Knuuttila et al. |
| 5,294,286 A | 3/1994 | Nishizawa et al. |
| 5,296,403 A | 3/1994 | Nishizawa et al. |
| 5,300,186 A | 4/1994 | Kitahara et al. |
| 5,306,666 A | 4/1994 | Izumi ........................ 437/192 |
| 5,311,055 A | 5/1994 | Goodman et al. |
| 5,316,615 A | 5/1994 | Copel et al. |
| 5,316,793 A | 5/1994 | Wallace et al. |
| 5,330,610 A | 7/1994 | Eres et al. |
| 5,336,324 A | 8/1994 | Stall et al. |
| 5,338,389 A | 8/1994 | Nishizawa et al. |
| 5,348,911 A | 9/1994 | Jurgensen et al. |
| 5,374,570 A | 12/1994 | Nasu et al. ..................... 437/40 |
| 5,395,791 A | 3/1995 | Cheng et al. |
| 5,438,952 A | 8/1995 | Otsuka et al. |
| 5,439,876 A | 8/1995 | Graf et al. |
| 5,441,703 A | 8/1995 | Jurgensen et al. |
| 5,443,033 A | 8/1995 | Nishizawa et al. |
| 5,443,647 A | 8/1995 | Aucoin et al. |
| 5,455,072 A | 10/1995 | Bension et al. |
| 5,458,084 A | 10/1995 | Thorne et al. |
| 5,469,806 A | 11/1995 | Mochizuki et al. |
| 5,480,818 A | 1/1996 | Matsumoto et al. |
| 5,483,919 A | 1/1996 | Yokoyama et al. |
| 5,484,664 A | 1/1996 | Kitahara et al. |
| 5,503,875 A | 4/1996 | Imai et al. |
| 5,521,126 A | 5/1996 | Okamura et al. |
| 5,526,044 A | 6/1996 | Tokumitsu et al. |
| 5,526,244 A | 6/1996 | Bishop ........................ 362/147 |
| 5,527,733 A | 6/1996 | Nishizawa et al. |
| 5,532,511 A | 7/1996 | Nishizawa et al. |
| 5,540,783 A | 7/1996 | Eres et al. |
| 5,580,380 A | 12/1996 | Liu et al. |
| 5,601,651 A | 2/1997 | Watabe et al. |
| 5,609,689 A | 3/1997 | Kato et al. |
| 5,616,181 A | 4/1997 | Yamamoto et al. |
| 5,637,530 A | 6/1997 | Gaines et al. |
| 5,641,984 A | 6/1997 | Aftergut et al. |
| 5,644,128 A | 7/1997 | Wollnik et al. |
| 5,667,592 A | 9/1997 | Boitnott et al. |
| 5,674,786 A | 10/1997 | Turner et al. |
| 5,693,139 A | 12/1997 | Nishizawa et al. |
| 5,695,564 A | 12/1997 | Imahashi et al. |
| 5,705,224 A | 1/1998 | Murota et al. |
| 5,707,880 A | 1/1998 | Aftergut et al. |
| 5,711,811 A | 1/1998 | Suntola et al. ............... 118/711 |
| 5,730,801 A | 3/1998 | Tepman et al. |
| 5,730,802 A | 3/1998 | Ishizumi et al. |
| 5,733,816 A | 3/1998 | Iyer et al. |
| 5,747,113 A | 5/1998 | Tsai |
| 5,749,974 A | 5/1998 | Habuka et al. |
| 5,788,447 A | 8/1998 | Yonemitsu et al. |
| 5,788,799 A | 8/1998 | Steger et al. |
| 5,796,116 A | 8/1998 | Nakata et al. |
| 5,801,634 A | 9/1998 | Young et al. |
| 5,804,488 A | 9/1998 | Shih et al. |
| 5,807,792 A | 9/1998 | Ilg et al. |
| 5,830,270 A | 11/1998 | McKee et al. |
| 5,834,372 A | 11/1998 | Lee et al. |
| 5,835,677 A | 11/1998 | Li et al. |
| 5,851,849 A | 12/1998 | Comizzoli et al. |
| 5,855,675 A | 1/1999 | Doering et al. |
| 5,855,680 A | 1/1999 | Soininen et al. |
| 5,856,219 A | 1/1999 | Naito et al. |
| 5,858,102 A | 1/1999 | Tsai |
| 5,866,213 A | 2/1999 | Foster et al. |
| 5,866,795 A | 2/1999 | Wang et al. |
| 5,879,459 A | 3/1999 | Gadgil et al. |
| 5,882,165 A | 3/1999 | Maydan et al. |
| 5,882,413 A | 3/1999 | Beaulieu et al. |
| 5,904,565 A | 5/1999 | Nguyen et al. |
| 5,916,365 A | 6/1999 | Sherman ...................... 117/92 |
| 5,923,056 A | 7/1999 | Lee et al. .................... 257/192 |
| 5,923,985 A | 7/1999 | Aoki et al. |
| 5,925,574 A | 7/1999 | Aoki et al. |
| 5,928,389 A | 7/1999 | Jevtic |
| 5,940,726 A | 8/1999 | Yu |
| 5,942,040 A | 8/1999 | Kim et al. |
| 5,947,710 A | 9/1999 | Cooper et al. |
| 5,972,430 A | 10/1999 | DiMeo, Jr. et al. |
| 5,989,345 A | 11/1999 | Hatano et al. |
| 6,001,669 A | 12/1999 | Gaines et al. |
| 6,015,590 A | 1/2000 | Suntola et al. ......... 427/255.23 |
| 6,015,917 A | 1/2000 | Bhandari et al. ............... 556/12 |
| 6,025,627 A | 2/2000 | Forbes et al. |
| 6,036,773 A | 3/2000 | Wang et al. |
| 6,042,652 A | 3/2000 | Hyun et al. .................. 118/719 |
| 6,043,177 A | 3/2000 | Falconer et al. |
| 6,051,286 A | 4/2000 | Zhao et al. |
| 6,062,798 A | 5/2000 | Muka |
| 6,071,808 A | 6/2000 | Merchant et al. |
| 6,084,302 A | 7/2000 | Sandhu ........................ 257/751 |
| 6,086,677 A | 7/2000 | Umotoy et al. |
| 6,099,604 A | 8/2000 | Sandhu et al. |
| 6,099,904 A | 8/2000 | Mak et al. |
| 6,110,556 A | 8/2000 | Bang et al. |
| 6,113,977 A | 9/2000 | Soininen et al. |
| 6,117,244 A | 9/2000 | Bang et al. |
| 6,124,158 A | 9/2000 | Dautartas et al. ............. 438/216 |
| 6,130,147 A | 10/2000 | Major et al. |
| 6,139,700 A | 10/2000 | Kang et al. ............ 204/192.17 |
| 6,140,237 A | 10/2000 | Chan et al. |
| 6,140,238 A | 10/2000 | Kitch |
| 6,143,659 A | 11/2000 | Leem et al. |
| 6,144,060 A | 11/2000 | Park et al. ................... 257/310 |

| Patent No. | Date | Inventor(s) | Ref |
|---|---|---|---|
| 6,156,382 A | 12/2000 | Rajagopalan et al. | |
| 6,158,446 A | 12/2000 | Mohindra et al. | |
| 6,162,715 A * | 12/2000 | Mak et al. | 438/592 |
| 6,174,377 B1 | 1/2001 | Doering et al. | |
| 6,174,809 B1 | 1/2001 | Kang et al. | 438/682 |
| 6,197,683 B1 | 3/2001 | Kang et al. | 438/643 |
| 6,200,893 B1 | 3/2001 | Sneh | 438/685 |
| 6,203,613 B1 | 3/2001 | Gates et al. | 117/104 |
| 6,206,967 B1 | 3/2001 | Mak et al. | |
| 6,207,302 B1 | 3/2001 | Sugiura et al. | 428/690 |
| 6,207,487 B1 | 3/2001 | Kim et al. | 438/238 |
| 6,218,298 B1 | 4/2001 | Hoinkis | |
| 6,245,192 B1 | 6/2001 | Dhindsa et al. | |
| 6,248,605 B1 | 6/2001 | Harkonen et al. | |
| 6,251,190 B1 | 6/2001 | Mak et al. | |
| 6,270,572 B1 | 8/2001 | Kim et al. | 117/93 |
| 6,271,148 B1 | 8/2001 | Kao et al. | |
| 6,274,484 B1 | 8/2001 | Tsai et al. | |
| 6,284,646 B1 | 9/2001 | Leem | 438/629 |
| 6,287,965 B1 | 9/2001 | Kang et al. | 438/648 |
| 6,291,876 B1 | 9/2001 | Stumborg et al. | |
| 6,294,836 B1 | 9/2001 | Paranjpe et al. | |
| 6,305,314 B1 | 10/2001 | Sneh et al. | 118/723 |
| 6,306,216 B1 | 10/2001 | Kim et al. | |
| 6,309,713 B1 | 10/2001 | Mak et al. | |
| 6,309,966 B1 | 10/2001 | Govindarajan et al. | |
| 6,316,098 B1 | 11/2001 | Yitzchaik et al. | |
| 6,326,297 B1 | 12/2001 | Vijayendran | |
| 6,333,260 B1 | 12/2001 | Kwon et al. | 438/643 |
| 6,335,280 B1 | 1/2002 | van der Jeugd | |
| 6,342,277 B1 | 1/2002 | Sherman | 427/562 |
| 6,348,376 B2 | 2/2002 | Lim et al. | 438/253 |
| 6,355,561 B1 | 3/2002 | Sandu et al. | 438/676 |
| 6,358,829 B2 | 3/2002 | Yoon et al. | 438/597 |
| 6,365,502 B1 | 4/2002 | Paranjpe et al. | |
| 6,368,954 B1 | 4/2002 | Lopatin et al. | 438/627 |
| 6,369,430 B1 | 4/2002 | Adetutu et al. | 257/382 |
| 6,372,598 B2 | 4/2002 | Kang et al. | 438/399 |
| 6,379,748 B1 | 4/2002 | Bhandari et al. | 427/255.394 |
| 6,391,785 B1 | 5/2002 | Satta et al. | 437/704 |
| 6,391,803 B1 | 5/2002 | Kim et al. | |
| 6,399,491 B2 | 6/2002 | Jeon et al. | 438/680 |
| 6,416,577 B1 | 7/2002 | Suntola et al. | 117/88 |
| 6,416,822 B1 | 7/2002 | Chiang et al. | 427/561 |
| 6,420,189 B1 | 7/2002 | Lopatin | 438/2 |
| 6,423,619 B1 | 7/2002 | Grant et al. | 438/589 |
| 6,428,859 B1 | 8/2002 | Chiang et al. | 427/457 |
| 6,447,933 B1 | 9/2002 | Wang et al. | 428/635 |
| 6,451,119 B2 | 9/2002 | Sneh et al. | 118/715 |
| 6,451,677 B1 * | 9/2002 | Lu et al. | 438/585 |
| 6,451,695 B2 | 9/2002 | Sneh | 438/685 |
| 6,458,701 B1 | 10/2002 | Chae et al. | 438/680 |
| 6,468,924 B2 | 10/2002 | Lee et al. | 438/763 |
| 6,475,276 B1 | 11/2002 | Elers et al. | 117/84 |
| 6,475,910 B1 | 11/2002 | Sneh | 438/685 |
| 6,478,872 B1 | 11/2002 | Chae et al. | |
| 6,482,262 B1 | 11/2002 | Elers et al. | 117/84 |
| 6,482,733 B2 | 11/2002 | Raaijmakers et al. | 438/633 |
| 6,482,740 B2 | 11/2002 | Soininen et al. | 438/686 |
| 6,486,437 B2 | 11/2002 | Tanabe | |
| 6,511,539 B1 | 1/2003 | Raaijmakers | 117/102 |
| 6,524,952 B1 | 2/2003 | Srinivas et al. | |
| 6,534,395 B2 | 3/2003 | Werkhoven et al. | 438/627 |
| 6,534,404 B1 | 3/2003 | Danek et al. | |
| 6,548,424 B2 | 4/2003 | Putkonen | 438/785 |
| 6,551,929 B1 | 4/2003 | Kori et al. | |
| 6,569,501 B2 | 5/2003 | Chiang et al. | |
| 6,585,823 B1 | 7/2003 | Van Wijck et al. | |
| 6,590,344 B2 | 7/2003 | Tao et al. | |
| 6,593,484 B2 | 7/2003 | Yasuhara et al. | |
| 6,596,602 B2 | 7/2003 | Iizuka et al. | |
| 6,599,572 B2 | 7/2003 | Saanila et al. | |
| 6,607,976 B2 | 8/2003 | Chen et al. | |
| 6,620,723 B1 | 9/2003 | Byun et al. | |
| 6,627,995 B2 | 9/2003 | Paranjpe et al. | |
| 6,630,201 B2 | 10/2003 | Chiang et al. | |
| 6,632,279 B1 | 10/2003 | Ritala et al. | |
| 6,635,965 B1 | 10/2003 | Lee et al. | |
| 6,645,847 B2 | 11/2003 | Paranjpe et al. | |
| 6,660,126 B2 | 12/2003 | Nguyen et al. | |
| 6,686,271 B2 | 2/2004 | Raaijmakers et al. | |
| 6,718,126 B2 | 4/2004 | Lei | |
| 6,740,585 B2 | 5/2004 | Yoon et al. | |
| 6,772,072 B2 | 8/2004 | Ganguli et al. | |
| 6,777,352 B2 | 8/2004 | Tepman et al. | |
| 6,784,096 B2 | 8/2004 | Chen et al. | |
| 6,790,773 B1 | 9/2004 | Drewery et al. | |
| 6,797,340 B2 | 9/2004 | Fang et al. | |
| 6,800,173 B2 | 10/2004 | Chiang et al. | |
| 6,803,272 B1 | 10/2004 | Halliyal et al. | |
| 6,809,026 B2 | 10/2004 | Yoon et al. | |
| 6,812,126 B1 | 11/2004 | Paranjpe et al. | |
| 6,814,087 B2 | 11/2004 | Chandran et al. | |
| 6,815,285 B2 | 11/2004 | Choi et al. | |
| 6,818,250 B2 | 11/2004 | George et al. | |
| 6,821,563 B2 | 11/2004 | Yudovsky | |
| 6,827,978 B2 * | 12/2004 | Yoon et al. | 427/250 |
| 6,831,004 B2 | 12/2004 | Byun et al. | |
| 6,833,161 B2 | 12/2004 | Wang et al. | |
| 6,838,125 B2 | 1/2005 | Chung et al. | |
| 6,838,376 B2 | 1/2005 | Matsuse et al. | |
| 6,846,516 B2 | 1/2005 | Yang et al. | |
| 6,855,368 B1 | 2/2005 | Kori et al. | |
| 6,861,356 B2 | 3/2005 | Matsuse et al. | |
| 6,875,271 B2 | 4/2005 | Glenn et al. | |
| 6,893,915 B2 | 5/2005 | Park et al. | |
| 6,905,541 B2 | 6/2005 | Chen et al. | |
| 6,915,592 B2 | 7/2005 | Guenther | |
| 6,932,871 B2 | 8/2005 | Chang et al. | |
| 6,936,538 B2 | 8/2005 | Byun | |
| 6,939,804 B2 | 9/2005 | Lai et al. | |
| 6,951,804 B2 | 10/2005 | Seutter et al. | |
| 6,955,211 B2 | 10/2005 | Ku et al. | |
| 6,958,174 B1 | 10/2005 | Klaus et al. | |
| 6,998,014 B2 | 2/2006 | Chen et al. | |
| 7,005,372 B2 | 2/2006 | Levy et al. | |
| 7,026,238 B2 | 4/2006 | Xi et al. | |
| 7,033,922 B2 | 4/2006 | Kori et al. | |
| 7,094,680 B2 | 8/2006 | Seutter et al. | |
| 7,101,795 B1 | 9/2006 | Xi et al. | |
| 7,115,494 B2 | 10/2006 | Sinha et al. | |
| 7,115,499 B2 | 10/2006 | Wang et al. | |
| 7,141,494 B2 | 11/2006 | Lee et al. | |
| 7,186,385 B2 | 3/2007 | Ganguli et al. | |
| 7,208,413 B2 | 4/2007 | Byun et al. | |
| 7,211,144 B2 | 5/2007 | Lu et al. | |
| 7,211,508 B2 | 5/2007 | Chung et al. | |
| 7,220,673 B2 | 5/2007 | Xi et al. | |
| 7,238,552 B2 | 7/2007 | Byun | |
| 7,262,125 B2 | 8/2007 | Wongsenakhum et al. | |
| 7,279,432 B2 * | 10/2007 | Xi et al. | 438/763 |
| 7,384,867 B2 | 6/2008 | Lai et al. | |
| 7,408,225 B2 | 8/2008 | Shinriki et al. | |
| 7,416,979 B2 | 8/2008 | Yoon et al. | |
| 7,429,516 B2 | 9/2008 | Wang et al. | |
| 7,465,665 B2 | 12/2008 | Xi et al. | |
| 7,465,666 B2 | 12/2008 | Kori et al. | |
| 2001/0000866 | 5/2001 | Sneh et al. | 118/723 |
| 2001/0002280 A1 | 5/2001 | Sneh | 427/255.28 |
| 2001/0002582 A1 * | 6/2001 | Dunham | 118/715 |
| 2001/0009140 A1 | 7/2001 | Bondestam et al. | 118/725 |
| 2001/0009695 A1 | 7/2001 | Saanila et al. | 427/255.39 |
| 2001/0011526 A1 | 8/2001 | Doering et al. | |
| 2001/0024387 A1 | 9/2001 | Raaijmakers et al. | 365/200 |
| 2001/0025979 A1 | 10/2001 | Kim et al. | 257/315 |
| 2001/0028924 A1 | 10/2001 | Sherman | 427/255.28 |

| Publication No. | Date | Inventor | Class |
|---|---|---|---|
| 2001/0029094 A1 | 10/2001 | Mee-Young et al. | 438/597 |
| 2001/0031562 A1 | 10/2001 | Raaijmakers et al. | |
| 2001/0034123 A1 | 10/2001 | Jeon et al. | 438/643 |
| 2001/0041250 A1 | 11/2001 | Werkhoven et al. | 428/212 |
| 2001/0042799 A1 | 11/2001 | Kim et al. | |
| 2001/0050039 A1 | 12/2001 | Park | 117/102 |
| 2001/0054730 A1 | 12/2001 | Kim et al. | 257/301 |
| 2001/0054769 A1 | 12/2001 | Raaijmakers et al. | 257/758 |
| 2002/0000598 A1 | 1/2002 | Kang et al. | 257/301 |
| 2002/0004293 A1 | 1/2002 | Soininen et al. | 438/584 |
| 2002/0007790 A1 | 1/2002 | Park | 118/715 |
| 2002/0009544 A1 | 1/2002 | Mcfeely et al. | |
| 2002/0016084 A1 | 2/2002 | Todd | |
| 2002/0019121 A1 | 2/2002 | Pyo | 438/618 |
| 2002/0020869 A1 | 2/2002 | Park et al. | 257/306 |
| 2002/0021544 A1 | 2/2002 | Cho et al. | 361/200 |
| 2002/0031618 A1 | 3/2002 | Sherman | 427/569 |
| 2002/0037630 A1 | 3/2002 | Agarwal et al. | 438/430 |
| 2002/0041931 A1 | 4/2002 | Suntola et al. | 427/255.28 |
| 2002/0047151 A1 | 4/2002 | Kim et al. | |
| 2002/0048635 A1 | 4/2002 | Kim et al. | 427/331 |
| 2002/0048880 A1 | 4/2002 | Lee | 438/253 |
| 2002/0052097 A1 | 5/2002 | Park | 438/507 |
| 2002/0055235 A1 | 5/2002 | Agarwal et al. | 438/430 |
| 2002/0060363 A1 | 5/2002 | Xi et al. | |
| 2002/0061612 A1 | 5/2002 | Sandhu et al. | 438/151 |
| 2002/0068458 A1 | 6/2002 | Chiang et al. | 438/694 |
| 2002/0073924 A1 | 6/2002 | Chiang et al. | 118/723 R |
| 2002/0074588 A1 | 6/2002 | Lee | 257/306 |
| 2002/0076481 A1 | 6/2002 | Chiang et al. | 427/8 |
| 2002/0076507 A1 | 6/2002 | Chiang et al. | 427/569 |
| 2002/0076508 A1 | 6/2002 | Chiang et al. | 427/569 |
| 2002/0076837 A1 | 6/2002 | Hujanen et al. | 438/3 |
| 2002/0081844 A1 | 6/2002 | Jeon et al. | 438/680 |
| 2002/0086111 A1 | 7/2002 | Byun et al. | |
| 2002/0086507 A1 | 7/2002 | Park et al. | |
| 2002/0090829 A1 | 7/2002 | Sandhu et al. | 438/761 |
| 2002/0094689 A1 | 7/2002 | Park | 438/694 |
| 2002/0098627 A1 | 7/2002 | Pomarede et al. | 438/149 |
| 2002/0104481 A1 | 8/2002 | Chiang et al. | 118/723 |
| 2002/0105088 A1 | 8/2002 | Yang et al. | 257/774 |
| 2002/0106536 A1 | 8/2002 | Lee et al. | 428/702 |
| 2002/0106846 A1 | 8/2002 | Seutter et al. | 438/200 |
| 2002/0109168 A1 | 8/2002 | Kim et al. | 257/295 |
| 2002/0115886 A1 | 8/2002 | Yasuhara et al. | |
| 2002/0117399 A1 | 8/2002 | Chen et al. | 205/125 |
| 2002/0121241 A1 | 9/2002 | Nguyen et al. | |
| 2002/0121342 A1 | 9/2002 | Nguyen et al. | |
| 2002/0121697 A1 | 9/2002 | Marsh | 257/751 |
| 2002/0135071 A1 | 9/2002 | Kang et al. | |
| 2002/0144655 A1 | 10/2002 | Chiang et al. | 118/715 |
| 2002/0144657 A1 | 10/2002 | Chiang et al. | 118/723 E |
| 2002/0146511 A1 | 10/2002 | Chiang et al. | 427/248.1 |
| 2002/0155722 A1 | 10/2002 | Satta et al. | 438/704 |
| 2002/0162506 A1 | 11/2002 | Sneh et al. | 118/715 |
| 2002/0164421 A1 | 11/2002 | Chiang et al. | 427/248.1 |
| 2002/0164423 A1 | 11/2002 | Chiang et al. | 427/255.28 |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2002/0187631 A1 | 12/2002 | Kim et al. | 438/637 |
| 2002/0197402 A1 | 12/2002 | Chiang et al. | 427/255.39 |
| 2002/0197856 A1 | 12/2002 | Matsuse et al. | |
| 2002/0197863 A1 | 12/2002 | Mak et al. | |
| 2003/0013300 A1 | 1/2003 | Byun | |
| 2003/0013320 A1 | 1/2003 | Kim et al. | 438/778 |
| 2003/0017697 A1 | 1/2003 | Choi et al. | |
| 2003/0022487 A1 | 1/2003 | Yoon et al. | |
| 2003/0029715 A1 | 2/2003 | Yu et al. | |
| 2003/0031807 A1 | 2/2003 | Elers et al. | 427/569 |
| 2003/0032281 A1 | 2/2003 | Werkhoven et al. | 438/640 |
| 2003/0038369 A1 | 2/2003 | Layadi et al. | |
| 2003/0042630 A1 | 3/2003 | Babcoke et al. | 261/121.1 |
| 2003/0049931 A1 | 3/2003 | Byun et al. | |
| 2003/0049942 A1 | 3/2003 | Haukka et al. | 438/778 |
| 2003/0053799 A1 | 3/2003 | Lei | |
| 2003/0054631 A1 | 3/2003 | Raaijmakers et al. | |
| 2003/0057526 A1 | 3/2003 | Chung et al. | |
| 2003/0057527 A1 | 3/2003 | Chung et al. | |
| 2003/0059538 A1 | 3/2003 | Chung et al. | |
| 2003/0072884 A1 | 4/2003 | Zhang et al. | |
| 2003/0072975 A1 | 4/2003 | Shero et al. | 428/704 |
| 2003/0079686 A1 | 5/2003 | Chen et al. | |
| 2003/0082296 A1 | 5/2003 | Elers et al. | 427/96 |
| 2003/0082300 A1 | 5/2003 | Todd et al. | 427/255.27 |
| 2003/0082301 A1 | 5/2003 | Chen et al. | |
| 2003/0082307 A1 | 5/2003 | Chung et al. | |
| 2003/0086111 A1 | 5/2003 | Akiyoshi | |
| 2003/0089308 A1 | 5/2003 | Raaijmakers | |
| 2003/0101927 A1 | 6/2003 | Raaijmakers | |
| 2003/0104126 A1 | 6/2003 | Fang et al. | |
| 2003/0106490 A1 | 6/2003 | Jallepally et al. | |
| 2003/0108674 A1 | 6/2003 | Chung et al. | |
| 2003/0116087 A1 | 6/2003 | Nguyen et al. | |
| 2003/0121608 A1 | 7/2003 | Chen et al. | |
| 2003/0123216 A1 | 7/2003 | Yoon et al. | |
| 2003/0124262 A1 | 7/2003 | Chen et al. | |
| 2003/0127043 A1 | 7/2003 | Lu et al. | |
| 2003/0129826 A1 | 7/2003 | Werkhoven et al. | |
| 2003/0134508 A1 | 7/2003 | Raaijmakers et al. | |
| 2003/0143328 A1 | 7/2003 | Chen et al. | |
| 2003/0143839 A1 | 7/2003 | Raaijmakers et al. | |
| 2003/0143841 A1 | 7/2003 | Yang et al. | |
| 2003/0153177 A1 | 8/2003 | Tepman et al. | |
| 2003/0153181 A1 | 8/2003 | Yoon et al. | |
| 2003/0157760 A1 | 8/2003 | Xi et al. | |
| 2003/0161952 A1 | 8/2003 | Wang et al. | |
| 2003/0165615 A1 | 9/2003 | Aaltonen et al. | |
| 2003/0168750 A1 | 9/2003 | Basceri et al. | |
| 2003/0173586 A1 | 9/2003 | Moriwaki et al. | |
| 2003/0181035 A1 | 9/2003 | Yoon et al. | |
| 2003/0186495 A1 | 10/2003 | Saanila et al. | |
| 2003/0190423 A1 | 10/2003 | Yang et al. | |
| 2003/0190497 A1 | 10/2003 | Yang et al. | |
| 2003/0190804 A1 | 10/2003 | Glenn et al. | |
| 2003/0194493 A1 | 10/2003 | Chang et al. | |
| 2003/0194825 A1 | 10/2003 | Law et al. | |
| 2003/0203616 A1 | 10/2003 | Chung et al. | |
| 2003/0205729 A1 | 11/2003 | Basceri et al. | |
| 2003/0213987 A1 | 11/2003 | Basceri et al. | |
| 2003/0219942 A1 | 11/2003 | Choi et al. | |
| 2003/0224217 A1 | 12/2003 | Byun et al. | |
| 2003/0224578 A1 | 12/2003 | Chung et al. | |
| 2003/0224600 A1 | 12/2003 | Cao et al. | |
| 2003/0232497 A1 | 12/2003 | Xi et al. | |
| 2004/0005749 A1 | 1/2004 | Choi et al. | |
| 2004/0009307 A1 | 1/2004 | Koh et al. | |
| 2004/0011504 A1 | 1/2004 | Ku et al. | |
| 2004/0013577 A1 | 1/2004 | Ganguli et al. | |
| 2004/0013803 A1 | 1/2004 | Chung et al. | |
| 2004/0014315 A1 | 1/2004 | Lai et al. | |
| 2004/0014320 A1 | 1/2004 | Chen et al. | |
| 2004/0015300 A1 | 1/2004 | Ganguli et al. | |
| 2004/0018304 A1 | 1/2004 | Chung et al. | |
| 2004/0018723 A1 | 1/2004 | Byun et al. | |
| 2004/0018747 A1 | 1/2004 | Lee et al. | |
| 2004/0025370 A1 | 2/2004 | Guenther | |
| 2004/0033698 A1 | 2/2004 | Lee et al. | |
| 2004/0041320 A1 | 3/2004 | Hodumi | |
| 2004/0043630 A1 | 3/2004 | Vaartstra et al. | |
| 2004/0046197 A1 | 3/2004 | Basceri et al. | |
| 2004/0065255 A1 | 4/2004 | Yang et al. | |
| 2004/0067641 A1 | 4/2004 | Yudovsky | |
| 2004/0077183 A1 | 4/2004 | Chung | |
| 2004/0170403 A1 | 9/2004 | Lei | |
| 2004/0187304 A1 | 9/2004 | Chen et al. | |

| | | | | | | |
|---|---|---|---|---|---|---|
| 2004/0202786 A1 | 10/2004 | Wongsenakhum et al. | GB | 2 355 727 | 5/2001 | |
| 2004/0209460 A1 | 10/2004 | Xi et al. | JP | 58098917 | 6/1983 | |
| 2004/0209465 A1 | 10/2004 | Xi et al. | JP | 58100419 | 6/1983 | |
| 2004/0211665 A1 | 10/2004 | Yoon et al. | JP | 60065712 | 4/1985 | |
| 2004/0219784 A1 | 11/2004 | Kang et al. | JP | 61035847 | 2/1986 | |
| 2004/0224506 A1 | 11/2004 | Choi et al. | JP | 61210623 | 9/1986 | |
| 2004/0235285 A1 | 11/2004 | Kang et al. | JP | 62069508 | 3/1987 | |
| 2004/0247788 A1 | 12/2004 | Fang et al. | JP | 62091495 | 4/1987 | |
| 2004/0256351 A1 | 12/2004 | Chung et al. | JP | 62141717 | 6/1987 | |
| 2005/0006799 A1 | 1/2005 | Gregg et al. | JP | 62167297 | 7/1987 | |
| 2005/0008779 A1 | 1/2005 | Yang et al. | JP | 62171999 | 7/1987 | |
| 2005/0009325 A1 | 1/2005 | Chung et al. | JP | 62232919 | 10/1987 | |
| 2005/0031786 A1 | 2/2005 | Lee et al. | JP | 63062313 | 3/1988 | |
| 2005/0059240 A1 | 3/2005 | Choi et al. | JP | 63085098 | 4/1988 | |
| 2005/0059241 A1 | 3/2005 | Kori et al. | JP | 63090833 | 4/1988 | |
| 2005/0104142 A1 | 5/2005 | Narayanan et al. | JP | 63222420 | 9/1988 | |
| 2005/0118804 A1 | 6/2005 | Byun et al. | JP | 63222421 | 9/1988 | |
| 2005/0164487 A1 | 7/2005 | Seutter et al. | JP | 63227007 | 9/1988 | |
| 2005/0176240 A1 | 8/2005 | Wang et al. | JP | 63252420 | 10/1988 | |
| 2005/0189072 A1 | 9/2005 | Chen et al. | JP | 63266814 | 11/1988 | |
| 2005/0191803 A1 | 9/2005 | Matsuse et al. | JP | 64009895 | 1/1989 | |
| 2005/0208217 A1 | 9/2005 | Shinriki et al. | JP | 64009896 | 1/1989 | |
| 2005/0208763 A1 | 9/2005 | Byun | JP | 64009897 | 1/1989 | |
| 2005/0257735 A1 | 11/2005 | Guenther | JP | 64037832 | 2/1989 | |
| 2005/0271814 A1 | 12/2005 | Chang et al. | JP | 64082615 | 3/1989 | |
| 2005/0287807 A1 | 12/2005 | Lai et al. | JP | 64082617 | 3/1989 | |
| 2006/0009034 A1 | 1/2006 | Lai et al. | JP | 64082671 | 3/1989 | |
| 2006/0024959 A1 | 2/2006 | Li et al. | JP | 64082676 | 3/1989 | |
| 2006/0030148 A1 | 2/2006 | Seutter et al. | JP | 01103982 | 4/1989 | |
| 2006/0040052 A1 | 2/2006 | Fang et al. | JP | 01103996 | 4/1989 | |
| 2006/0075966 A1 | 4/2006 | Chen et al. | JP | 64090524 | 4/1989 | |
| 2006/0128132 A1 | 6/2006 | Sinha et al. | JP | 01117017 | 5/1989 | |
| 2006/0128150 A1 | 6/2006 | Gandikota et al. | JP | 01143221 | 6/1989 | |
| 2006/0156979 A1 | 7/2006 | Thakur et al. | JP | 01143233 | 6/1989 | |
| 2006/0199372 A1 | 9/2006 | Chung et al. | JP | 01154511 | 6/1989 | |
| 2006/0257295 A1 | 11/2006 | Chen et al. | JP | 01236657 | 9/1989 | |
| 2006/0264031 A1 | 11/2006 | Xi et al. | JP | 01245512 | 9/1989 | |
| 2006/0276020 A1 | 12/2006 | Yoon et al. | JP | 01264218 | 10/1989 | |
| 2006/0292874 A1 | 12/2006 | Kori et al. | JP | 01270593 | 10/1989 | |
| 2007/0003698 A1 | 1/2007 | Chen et al. | JP | 01272108 | 10/1989 | |
| 2007/0009658 A1 | 1/2007 | Yoo et al. | JP | 01290221 | 11/1989 | |
| 2007/0020890 A1 | 1/2007 | Thakur et al. | JP | 01290222 | 11/1989 | |
| 2007/0020924 A1 | 1/2007 | Wang et al. | JP | 01296673 | 11/1989 | |
| 2007/0026147 A1 | 2/2007 | Chen et al. | JP | 01303770 | 12/1989 | |
| 2007/0067609 A1 | 3/2007 | Chen et al. | JP | 01305894 | 12/1989 | |
| 2007/0099415 A1 | 5/2007 | Chen et al. | JP | 01313927 | 12/1989 | |
| 2007/0119370 A1 | 5/2007 | Ma et al. | JP | 02012814 | 1/1990 | |
| 2007/0119371 A1 | 5/2007 | Ma et al. | JP | 02014513 | 1/1990 | |
| 2007/0128862 A1 | 6/2007 | Ma et al. | JP | 02017634 | 1/1990 | |
| 2007/0128863 A1 | 6/2007 | Ma et al. | JP | 02063115 | 3/1990 | |
| 2007/0128864 A1 | 6/2007 | Ma et al. | JP | 02074029 | 3/1990 | |
| 2007/0190780 A1 | 8/2007 | Chung et al. | JP | 02074587 | 3/1990 | |
| 2007/0197027 A1 | 8/2007 | Byun et al. | JP | 02106822 | 4/1990 | |
| 2007/0197028 A1 | 8/2007 | Byun et al. | JP | 02129913 | 5/1990 | |
| 2008/0008823 A1 | 1/2008 | Chen et al. | JP | 02162717 | 6/1990 | |
| 2008/0014352 A1 | 1/2008 | Xi et al. | JP | 02172895 | 7/1990 | |
| 2008/0014724 A1 | 1/2008 | Byun | JP | 02196092 | 8/1990 | |
| 2008/0206987 A1 | 8/2008 | Gelatos et al. | JP | 02203571 | 8/1990 | |
| 2008/0227291 A1 | 9/2008 | Lai et al. | JP | 02230690 | 9/1990 | |
| 2008/0268636 A1 | 10/2008 | Yoon et al. | JP | 02230722 | 9/1990 | |
| 2008/0305629 A1 | 12/2008 | Wang et al. | JP | 2-246161 | 10/1990 | |
| 2008/0317954 A1 | 12/2008 | Lu et al. | JP | 02264491 | 10/1990 | |
| | | | JP | 02283084 | 11/1990 | |
| | FOREIGN PATENT DOCUMENTS | | JP | 02304916 | 12/1990 | |
| | | | JP | 03019211 | 1/1991 | |
| DE | 19820147 | 7/1999 | JP | 03022569 | 1/1991 | |
| EP | 0344352 | 12/1989 | JP | 03023294 | 1/1991 | |
| EP | 0429270 | 5/1991 | JP | 03023299 | 1/1991 | |
| EP | 0442290 | 8/1991 | JP | 03044967 | 2/1991 | |
| EP | 0799641 | 10/1997 | JP | 03048421 | 3/1991 | |
| EP | 1 167 569 | 1/2002 | JP | 03070124 | 3/1991 | |
| FR | 2626110 | 7/1989 | JP | 03185716 | 8/1991 | |
| FR | 2692597 | 12/1993 | JP | 03208885 | 9/1991 | |

| | | | | | | |
|---|---|---|---|---|---|---|
| JP | 03234025 | 10/1991 | | JP | 2001020075 | 1/2001 |
| JP | 03286522 | 12/1991 | | JP | 2001062244 | 3/2001 |
| JP | 03286531 | 12/1991 | | JP | 2001111000 | 4/2001 |
| JP | 04031391 | 2/1992 | | JP | 2001152339 | 6/2001 |
| JP | 04031396 | 2/1992 | | JP | 2001172767 | 6/2001 |
| JP | 04100292 | 4/1992 | | JP | 2001189312 | 7/2001 |
| JP | 04111418 | 4/1992 | | JP | 2001217206 | 8/2001 |
| JP | 04132214 | 5/1992 | | JP | 2001220287 | 8/2001 |
| JP | 04132681 | 5/1992 | | JP | 2001220294 | 8/2001 |
| JP | 04151822 | 5/1992 | | JP | 2001240972 | 9/2001 |
| JP | 04162418 | 6/1992 | | JP | 2001254181 | 9/2001 |
| JP | 04175299 | 6/1992 | | JP | 2001284042 | 10/2001 |
| JP | 04186824 | 7/1992 | | JP | 2001303251 | 10/2001 |
| JP | 04212411 | 8/1992 | | JP | 2001328900 | 11/2001 |
| JP | 04260696 | 9/1992 | | WO | WO-9002216 | 3/1990 |
| JP | 04273120 | 9/1992 | | WO | WO-9110510 | 7/1991 |
| JP | 04285167 | 10/1992 | | WO | WO-9302111 | 2/1993 |
| JP | 04291916 | 10/1992 | | WO | WO 96/17107 | 6/1996 |
| JP | 04325500 | 11/1992 | | WO | WO-9618756 | 6/1996 |
| JP | 04328874 | 11/1992 | | WO | WO-9806889 | 2/1998 |
| JP | 05029228 | 2/1993 | | WO | WO 98/51838 | 11/1998 |
| JP | 05047665 | 2/1993 | | WO | WO 99/01595 | 1/1999 |
| JP | 05047666 | 2/1993 | | WO | WO-9913504 | 3/1999 |
| JP | 05047668 | 2/1993 | | WO | WO-9919260 | 4/1999 |
| JP | 05074717 | 3/1993 | | WO | WO 99/29924 | 6/1999 |
| JP | 05074724 | 3/1993 | | WO | WO-9941423 | 8/1999 |
| JP | 05102189 | 4/1993 | | WO | WO 99/65064 | 12/1999 |
| JP | 05160152 | 6/1993 | | WO | WO 00/15865 | 3/2000 |
| JP | 05175143 | 7/1993 | | WO | WO 00/16377 | 3/2000 |
| JP | 05175145 | 7/1993 | | WO | WO-0011721 | 3/2000 |
| JP | 05182906 | 7/1993 | | WO | WO-0015881 | 3/2000 |
| JP | 05186295 | 7/1993 | | WO | WO 00/54320 | 9/2000 |
| JP | 05206036 | 8/1993 | | WO | WO 00/63957 | 10/2000 |
| JP | 05234899 | 9/1993 | | WO | WO 00/79576 | 12/2000 |
| JP | 05235047 | 9/1993 | | WO | WO-0079019 | 12/2000 |
| JP | 05251339 | 9/1993 | | WO | WO 01/15220 | 3/2001 |
| JP | 05270997 | 10/1993 | | WO | WO 01/17692 | 3/2001 |
| JP | 05283336 | 10/1993 | | WO | WO 01/27346 | 4/2001 |
| JP | 05291152 | 11/1993 | | WO | WO 01/27347 | 4/2001 |
| JP | 05304334 | 11/1993 | | WO | WO 01/29280 | 4/2001 |
| JP | 05343327 | 12/1993 | | WO | WO 01/29891 | 4/2001 |
| JP | 05343685 | 12/1993 | | WO | WO 01/29893 | 4/2001 |
| JP | 06045606 | 2/1994 | | WO | WO 01/36702 | 5/2001 |
| JP | 06132236 | 5/1994 | | WO | WO-0140541 | 6/2001 |
| JP | 06177381 | 6/1994 | | WO | WO 01/66832 | 9/2001 |
| JP | 06196809 | 7/1994 | | WO | WO 02/08485 | 1/2002 |
| JP | 06222388 | 8/1994 | | WO | WO-0201628 | 1/2002 |
| JP | 06224138 | 8/1994 | | WO | WO 02/43115 | 5/2002 |
| JP | 06230421 | 8/1994 | | WO | WO 02/45167 | 6/2002 |
| JP | 06252057 | 9/1994 | | WO | WO-0245871 | 6/2002 |
| JP | 06291048 | 10/1994 | | WO | WO-0246489 | 6/2002 |
| JP | 07070752 | 3/1995 | | WO | WO 02/067319 | 8/2002 |
| JP | 07086269 | 3/1995 | | WO | WO-2004106584 | 12/2004 |
| JP | 07300649 | 11/1995 | | WO | 2005/027211 | 3/2005 |
| JP | 08181076 | 7/1996 | | | | |
| JP | 08245291 | 9/1996 | | | | |
| JP | 08264530 | 10/1996 | | | | |
| JP | 09260786 | 10/1997 | | | | |
| JP | 09293681 | 11/1997 | | | | |
| JP | 10188840 | 7/1998 | | | | |
| JP | 10190128 | 7/1998 | | | | |
| JP | 10-308283 | 11/1998 | | | | |
| JP | 11269652 | 10/1999 | | | | |
| JP | 2000-31387 | 1/2000 | | | | |
| JP | 2000-58777 | 2/2000 | | | | |
| JP | 2000068072 | 3/2000 | | | | |
| JP | 2000087029 | 3/2000 | | | | |
| JP | 2000138094 | 5/2000 | | | | |
| JP | 2000178735 | 6/2000 | | | | |
| JP | 2000218445 | 8/2000 | | | | |
| JP | 2000319772 | 11/2000 | | | | |
| JP | 2000340883 | 12/2000 | | | | |
| JP | 2000353666 | 12/2000 | | | | |

OTHER PUBLICATIONS

Yang, et al. "Atomic Layer Deposition of Tungsten Film from WF6/B2H6: Nucleation Layer for Advanced Semiconductor Device," Conference Proceedings ULSI XVII (2002) Materials Research Society.

Klaus, et al. "Atomic Layer Deposition of $SiO_2$ Using Catalyzed and Uncatalyzed Self-Limiting Surface Reactions," Surface Review and Letters, vol. 6, Nos. 3 & 4 (1999) 435-448.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Ritala, et al. "Perfectly Conformal TiN and $Al_2O_3$ Films Deposited by Atomic Layer Deposition," Chem. Vap. Deposition 1999, 5, No. 1.

Ritala, et al. "Atomic Layer Epitaxy Growth of TiN Thin Films," J. Electrochem. Soc., vol. 142, No. 8, Aug. 1995.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Growth of Titanium Dioxide Thin Films by Atomic Layer Epitaxy," Thin Solid Films, vol. 225, No. 1-2 (Mar. 25, 1993) pp. 288-295.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Atomic Layer Epitaxy Growth of TiN Thin Films From $TiI_4$ and $NH_3$," J. Electrochem. Soc., vol. 145, No. 8 (Aug. 1998) pp. 2914-2920.

Martensson, et al. "Use of Atomic Layer Epitaxy for Fabrication of Si/TiN/Cu Structures," J. Vac. Sci. & Tech. B, vol. 17, No. 5, (Sep. 1999) pp. 2122-2128.

Proceedings of the ICEEE 1998 International Interconnect Technology Conference—San Francisco, California, Jun. 1-3, 1998.

Niinisto, et al. "Synthesis of Oxide Thin Films and Overlayers by Atomic Layer Epitaxy for Advanced Applications," Materials Science and Engineering B41 (1996) 23-29.

Min, et al. "Metal-organic Atomic-layer Deposition of Titanium-silicon-nitride films," Applied Physics Letters, vol. 75, No. 11 (Sep. 13, 1999).

Min, et al. "Chemical Vapor Deposition of Ti-Si-N Films With Alternating Source Supply," Mat. Rec. Soc. Symp. Proc. vol. (1999).

Min, et al. "Atomic Layer Deposition of TiN Thin Films by Sequential Introduction of Ti Precursor and NH3," Mat. Res. Soc. Symp. Proc. vol. 514 (1998).

George, et al. "Surface Chemistry for Atomic Layer Growth," J. Phys. Chem. 1996, 100, 13121-13131.

Hwang, et al. "Nanometer-Size $\alpha$-$PbO_2$-type $TiO_2$ in Garnet: A Thermobarometer for Ultrahigh-Pressure Metamorphism," Science Vo. 288 (Apr. 14, 2000).

Kukli, et al., "Tailoring the Dielectric Properties of $HfO_2$-$Ta_2$-$O_5$ Nanolaminates," Applied Physics Letters, vol. 68, No. 26, Jun. 24, 1996; p. 3737-9.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670-5.

Kukli, et al., "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236-242.

Kukli, et al., "Properties of $Ta_2O_5$-Based Dielectric Nanolaminates Deposited by Atomic Layer Epitaxy," Journal of the Electrochemical Society, vol. 144, No. 1, Jan. 1997; p. 300-6.

Kukli, et al., "Properties of $\{Nb_{1-x}Ta_x\}_2O_5$ Solid Solutions and $\{Nb_{1-x}Ta_x\}_2O_5$-$ZrO_2$ Nanolaminates Grown by Atomic Layer Epitaxy," 1997; p. 785-93.

Ritala, M., et al., "Chemical Vapor Deposition," Jan. 1999, p. 6-9.

Eisenbraum, et al. "Atomic Layer Deposition (ALD) of Tantalum-based materials for zero thickness copper barrier applications," Proceedings of the IEEE 2001 International Interconnect Technology Conference (Cat. No. 01EX461) 2001.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Ashtiani, et al. "Pulsed Nucleation Layer of Tungsten Nitride Barrier Film and its Application in DRAM and Logic Manufacturing," SEMI Technical Symposium: Innovations in Semiconductor Manufacturing (STS: ISM), SEMICON Korea 2006, Semiconductor Equipment and Materials International, pp. 1-6.

Bader, et al. "Integrated Processing Equipment," Solid State Technology, Cowan Pub., vol. 33, No. 5 (May 1, 1990), pp. 149-154.

Bedair "Atomic Layer Epitaxy Deposition Processes," J. Vac. Sci. Techol. 12(1) (Jan./Feb. 1994).

Buerke, et al. "PNL™ low Resistivity tungsten for contact fill," Conference Proceedings AMC XXI, 2006, Materials Research Society, pp. 221-226.

Cameron, et al. "Atomic Layer Deposition of $SiO_2$ and $TiO_2$ in Alumina Tubular Membranes," Langmuir, vol. 16, No. 19 American Chemical Society, 2000 pp. 7435-7444.

Cheong, et al. "The Evaluation of ALD-WN/W Process for Sub-70nm Contact Plug Technology," ALD 2005 Conference.

Choi, et al. "Stability of $TiB_2$ as a Diffusion Barrier on Silicon," J. Electrochem. Soc. 138(10) (Oct. 1991), pp. 3062-3067.

Choi, et al. "The Effect of Annealing on Resistivity of Low Pressure Chemical Vapor Deposited Titanium Diboride," J. Appl. Phys. 69(11) (Jun. 1, 1991) pp. 7853-7861.

Derbyshire "Applications of Integrated Processing," Solid State Technology, US, Cowan Pub., vol. 37, No. 12 (Dec. 1, 1994), pp. 45-47.

Elam, et al. "Nucleation and Growth During Tungsten Atomic Layer Deposition on $SiO_2$ Surfaces," Thin Solid Films, 386, (2001), pp. 41-52.

Elam, et al. "Kinetics of the $WF_6$ and $Si_2H_6$ surface reactions during tungsten atomic layer deposition," Surface Science, 479, 2001, pp. 121-135.

Elers, et al. "$NbCl_5$ As a Precursor in Atomic Layer Epitaxy," Appl. Surf. Sci., vol. 82/83 (1994), pp. 468-474.

Fabreguette, et al. "Quartz crystal microbalance study of tungsten atomic layer deposition using $WF_6$ and $Si_2H_6$," Thin Solid Films, 488, 2005, pp. 103-110.

Fabreguette, et al. "Ultrahigh x-ray reflectivity from $W/Al_2O_3$ multilayers fabricated using atomic layer deposition," Applied Physics Letter, 88, 2006, pp. 013116-1-013116-3.

Frohberg, et al. "Filling contacts using a pulsed nucleation later of tungsten nitride," Micro: TechEmergent, Mar. 27, 2006, pp. 1-10, http://www.micormagazine.com/archive/05/10/frohberg.html.

George, et al. "Atomic Layer Controlled Deposition of $SiO_2$ and $Al_2O_3$ Using ABAB . . . Binary Reaction Sequence Chemistry," Appl. Surf. Sci., vol. 82/83 (1994),pp. 460-467.

Goswami, et al. Transition Metals Show Promise as Copper Barriers, Semiconductor International, ATMI, San Jose—May 1, 2004, Semiconductor International, pp. 1-7.

Grubbs, et al. "Gas phase reaction products during tungsten atomic layer deposition using $WF_6$ and $Si_2H_6$," J. Vac. Sci. Technol., B, vol. 22, No. 4, Jul./Aug. 2004, American Vacuum Society, pp. 1811-1821.

Grubbs, et al. "Nucleation and growth during the atomic layer deposition of W on $Al_2O_3$ and $Al_2O_3$ on W," Thin Solid Films, 467, 2004 pp. 16-27.

Hong, et al. "Characteristics of PAALD-TaN thin films derived from TAIMATA precursor for copper metallization," Interconnect Technology Conference, 2004. Proceedings of the IEEE 2004 International, Jun. 7-9, 2004, Abstract.

Hultman, et al. "Review of the Thermal and Mechanical Stability of TiN-based Thin Films," Z. Metallkd. 90 (1999) 10, pp. 803-813.

IBM Technical Disclosure Bulletin "Knowledge-Based Dynamic Scheduler in Distributed Computer Control," Jun. 1990, pp. 80-84.

IBM Technical Disclosure Bulletin "Multiprocessor and Multitasking Architecture for Tool Control of the Advanced via Inspection Tools," May 1992, pp. 190-191.

Kang "Applications and challenges of atomic layer deposition for semiconductor process," AVS $5^{th}$ International Conference on Atomic Layer Deposition 2005, Aug. 8-10, 2005, San Jose, CA.

Kim, et al. "Atomic layer deposited tungsten nitride thin film as contact barrier layer for sub-80 nm dynamic random access memory," Conference Proceedings AMC XXI, 2006 Materials Research Society.

Kim, et al. "Atomic Layer Deposition of Low Resistivity and High-Density Tungsten Nitride Thin Film Using $B_2H_6$, $WF_6$ and $NH_3$," Electrochem. Solid-State Lett., vol. 9, Issue 3, (2006), pp. C54-C57.

Kitagawa, et al. "Hydrogen-mediated low-temperature epitaxy of Si in plasma-enhanced chemical vapor deposition," Applied Surface Science 159-160 (2000), pp. 30-34.

Klaus, et al. "Atomic Layer Deposition of Tungsten Using Sequential Surface Chemistry with a Sacrificial Stripping Reaction," Thin Solid Films, 360, 2000, pp. 145-153.

Klaus, et al. "Atomic Layer Deposition of Tungsten Nitride Films Using Sequential Surface Reactions," Journal of the Electrochemical Society, vol. 147, No. 3, 2000, pp. 1175-1181.

Lee "The Preparation of Titanium-Based Thin Film by CVD Using Titanium Chlorides as Precursors," Chemical Vapor Deposition, 5(2) Mar. 1999, pp. 69-73.

Lee, et al. "Pulsed Nucleation for Ultra-High Aspect Ratio Tungsten Plugfill," Conference Proceedings ULSI XVIII, Materials Research Society, 2002, pp. 649-654.

Martensson, et al. "Atomic Layer Epitaxy of Copper on Tantalum," Chem. Vap. Deposition (1997) 3, No. 1, pp. 45-50.

Martensson, et al. "Atomic Layer Epitaxy of Copper, Growth & Selectivity in the Cu (II)-2,2.6,6-Tetramethyl-3, 5-Heptanedion ATE/ H2 Process," J. Electrochem. Soc.,145(8) (Aug. 1998), pp. 2926-2931.

Maydan "Cluster Tools for Fabrication of Advanced Devices," Jap. J. of Applied Physics, Extended Abstracts, $22^{nd}$ Conference Solid State Devices and Materials (1990), pp. 849-852.

McGeachin "Synthesis and Properties of Some β-diketimines Derived From Acetylacetone, and Their Metal Complexes," Canadian J. of Chemistry, vol. 46 (1968), pp. 1903-1912.

Ohba, et al. "Thermal Decomposition of Methylhydrazine and Deposition Properties of CVD TiN Thin Films," Conference Proceeding (1994) Mat. Res. Soc., pp. 143-149.

Park, et al. "Performance improvement of MOSFET with $HfO_2$-$Al_2O_3$ laminate gate dielectric and CVD-TaN metal gate deposited by TAIMATA", Electron Devices Meeting, 2003. IEDM '03 Techinical Digest. IEEE International Dec. 8-10, 2003.

Scheper, et al. "Low-temperature deposition of titanium nitride films from dialkylhydrazine-based precursors," Materials Science in Semiconductor Processing 2 (1999), pp. 149-157.

Sechrist, et al. "Optimization and Structural Characterization of $W/Al_2O_3$ Nanolaminates Grown Using Atomic Layer Deposition Techniques," Chem. Matter, 17, 2005, American Chemical Society, pp. 3475-3485.

Shenai, et al. "Correlation of vapor pressure equation and film properties with trimethylindium purity for the MOVPE grown III-V compounds," Journal of Crystal Growth 248 (2003), pp. 91-98.

Solanki, et al. "Atomic Layer Deposition of Copper Seed Layers," Electrochemical and Sold State Letters, vol. 3, No. 10 (2000), pp. 479-480.

Suzuki, et al. "LPCVD-TiN Using Hydrazine and $TiCl_4$," VMIC Conference (Jun. 8-9, 1993), pp. 418-423.

Wise, et al. "Diethyldiethoxysilane as a New Precursor for $SiO_2$ Growth on Silicon", Mat. Res. Soc. Symp. Proc., vol. 334 (1994), pp. 37-43.

Yamaga, et al. "Atomic layer epitaxy of ZnS by a new gas supplying system in low-pressure metalorganic vapor phase epitaxy," J. of Crystal Growth 117 (1992), pp. 152-155.

Yamaguchi, et al. "Atomic-layer Chemical-Vapor-Deposition of Silicon Dioxide Films With Extremely Low Hydrogen Content," Appl. Surf. Sci., vol. 130-132 (1998) pp. 202-207.

\* cited by examiner

SYSTEM AND METHOD FOR FORMING AN INTEGRATED BARRIER LAYER

CROSS-REFERENCE TO RELATED APPLICATION

This application is a continuation of U.S. patent application Ser. No. 10/414,271, entitled "System and Method for Forming an Integrated Barrier Layer", filed Apr. 15, 2003 now U.S. Pat. No. 7,279,432, which claims the benefit of U.S. Provisional Application No. 60/386,221 filed Apr. 16, 2002, which are herein incorporated by references.

BACKGROUND OF THE DISCLOSURE

1. Field of the Invention

Embodiments of the present invention generally relate to a method of barrier layer formation and, more particularly to a method of integrated barrier layer formation using both cyclical deposition techniques and chemical vapor deposition techniques.

2. Description of the Background Art

In the manufacture of integrated circuits, contact level metallization schemes are often used to provide low resistance contacts to an underlying semiconductor material. Typically, contact level metallization schemes combine an integrated barrier layer with a contact level metal layer.

For example, when a gate electrode of a transistor is fabricated, an integrated barrier layer (e.g., titanium nitride/tungsten (TiN/W)) is formed between the gate material (e.g., polysilicon) and the contact level metal layer (e.g., aluminum (Al) or copper (Cu)) of the gate electrode. The integrated barrier layer inhibits the diffusion of the aluminum (Al) or copper (Cu) into the polysilicon gate material. Such aluminum (Al) or copper (Cu) diffusion is undesirable because it potentially changes the characteristics of the transistor, rendering the transistor inoperable.

The integrated barrier layer typically comprises two different material layers. Each of the material layers is typically formed using a separate process chamber. For example, separate deposition chambers may be used for depositing the titanium nitride (TiN) layer and the tungsten (W) layer comprising a titanium nitride/tungsten (TiN/W) integrated barrier layer. The separate deposition chambers may include, for example, physical vapor deposition (PVD) chambers and/or chemical vapor deposition (CVD) chambers. However, the use of separate deposition chambers to form each material layer comprising the integrated barrier layer is costly.

Additionally, as circuit densities increase, the widths of integrated circuit features such as, for example, gate electrodes, may decrease to sub-micron dimensions (e.g., less than 0.25 micrometers), whereas the thickness of material layers between such features typically remains substantially constant, increasing the aspect ratios therefor. The term aspect ratio as used herein refers to the ratio of the feature height divided by the feature width. Many traditional deposition processes have difficulty filling sub-micron features where the aspect ratio exceeds 8:1, and especially where the aspect ratio exceeds 10:1.

FIG. 1 illustrates the possible consequences of material layer deposition in a high aspect ratio feature 6 formed on a substrate 1. The high aspect ratio feature 6 may be any opening such as a space formed between adjacent features 2, a contact, a via, or a trench defined in a material layer. As shown in FIG. 1, a material layer 11 that is formed using conventional deposition techniques (e.g., chemical vapor deposition (CVD) and/or physical vapor deposition (PVD)) tends to be deposited on the top edges 6T of the feature 6 at a higher rate than at the bottom 6B or sides 6S thereof creating an overhang. This overhang or excess deposition of material is sometimes referred to as crowning. Such excess material continues to build up on the top edges 6T of the feature 6, until the opening is closed off by the deposited material 11, forming a void 4 therein. The presence of voids may result in unreliable integrated circuit performance.

Therefore, a need exists for a system and method for forming integrated barrier layer structures.

SUMMARY OF THE INVENTION

An apparatus and method for forming an integrated barrier layer on a substrate is described. The integrated barrier layer comprises at least a first refractory metal layer and a second refractory metal layer. The integrated barrier layer is formed using a dual-mode deposition process comprising a chemical vapor deposition (CVD) step and a cyclical deposition step. The dual-mode deposition process may be performed in a single process chamber.

In one embodiment, the apparatus includes a process chamber having a gas distribution plate therein. The gas distribution plate is configured to include two distribution zones for providing process gases to the chamber for both the chemical vapor deposition (CVD) process and the cyclical deposition process. A first distribution zone comprises a center opening through which process gases for the cyclical deposition process are provided to the process chamber. A second distribution zone comprises a plurality of openings radially dispersed around the center opening. The first distribution zone and the second distribution zone are isolated from one another to inhibit mixing of the process gases.

In operation, a substrate is provided to the process chamber. A first refractory metal layer may be formed on the substrate using a chemical vapor deposition (CVD) process. Thereafter, a second refractory metal layer may be formed on the first refractory metal layer using a cyclical deposition process. Each of the first and second refractory metal layers may comprise a different refractory metal. For example, the integrated barrier layer may comprise a titanium nitride (TiN) layer formed using a chemical vapor deposition (CVD) process and a tungsten (W) layer formed on the titanium nitride (TiN) layer using a cyclical deposition process.

The integrated barrier layer is compatible with integrated circuit fabrication processes. In one integrated circuit fabrication process, the integrated barrier layer may be used in a copper (Cu) interconnect structure. For a copper (Cu) interconnect fabrication process, a preferred process sequence includes providing a substrate having an interconnect pattern defined in a dielectric material layer. An integrated barrier layer comprising a first refractory metal layer formed with a chemical vapor deposition (CVD) process and a second refractory metal layer formed with a cyclical deposition process is deposited on the interconnect pattern defined in the dielectric material using a single process chamber. Thereafter, the interconnect structure is completed by filling the interconnect pattern defined in the dielectric material with copper (Cu).

In another integrated circuit fabrication process, the integrated barrier layer may be used as a diffusion barrier for gate electrodes. For a gate electrode fabrication process, a preferred process sequence includes providing a substrate having gate regions formed on the surface thereof. The gate regions are surrounded by a dielectric material. An integrated barrier layer comprising a first refractory metal layer formed with a chemical vapor deposition (CVD) process and a second refractory metal layer formed with a cyclical deposition process is deposited on the gate regions using a single process chamber. Thereafter, the gate electrodes are completed by depositing a gate metal layer on the integrated barrier layer.

The integrated barrier layer may also be used as a diffusion barrier for one or more electrodes of three-dimensional capacitor structures such as for example, trench capacitors and crown capacitors. For a trench capacitor structure, a preferred process sequence includes providing a substrate having trenches defined therein. The trenches include a first electrode and a dielectric material conformably formed along the sidewalls of the trenches. An integrated barrier layer comprising a first refractory metal layer formed with a chemical vapor deposition (CVD) process and a second refractory metal layer formed with a cyclical deposition process is deposited on the dielectric material in the trenches using a single process chamber. Thereafter, the trench capacitor structure is completed by depositing a second electrode on the integrated barrier layer.

BRIEF DESCRIPTION OF THE DRAWINGS

So that the manner in which the above recited features of the present invention are attained and can readily be understood in detail, a more particular description of the invention, briefly summarized above, may be had by reference to the embodiments thereof which are illustrated in the appended drawings.

It is to be noted, however, that the appended drawings illustrate only typical embodiments of the invention and are therefore not to be considered limiting of its scope, for the invention may admit to other equally effective embodiments.

DETAILED DESCRIPTION

Figure 1:
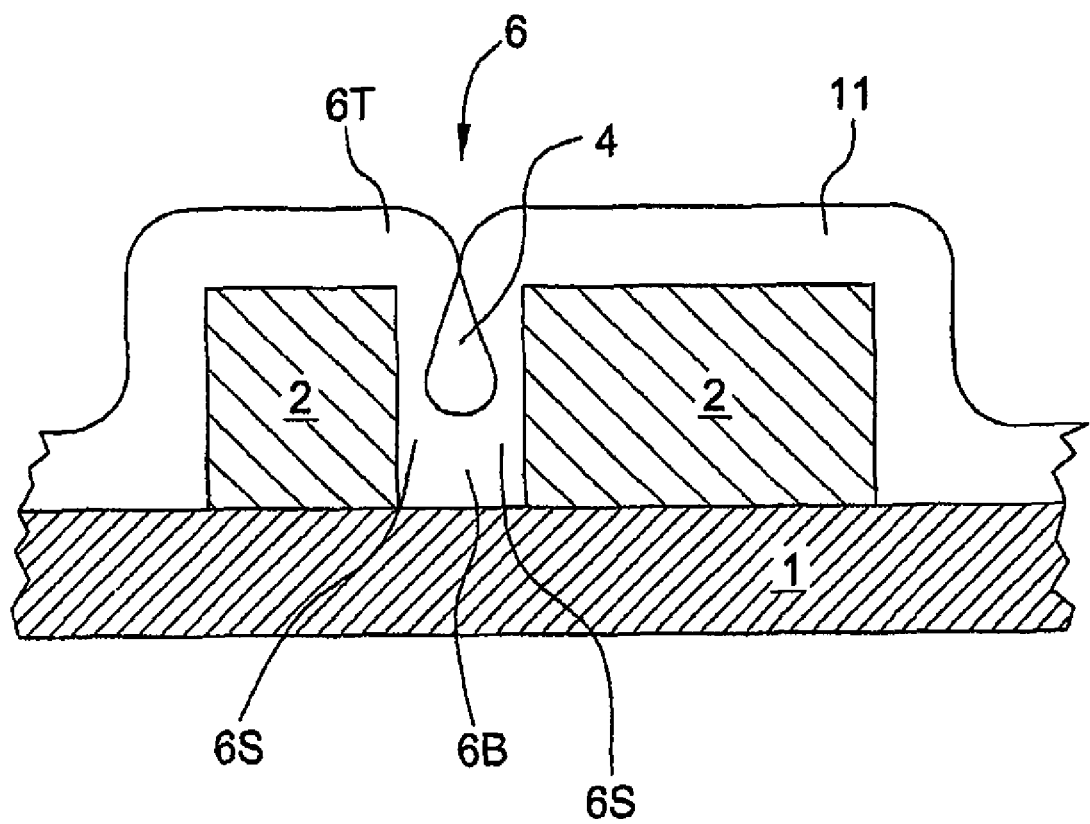
FIG. 1 is a cross-sectional view of one possible deposition result for high aspect ratio features filled using conventional prior art deposition techniques.
Figure 2A:
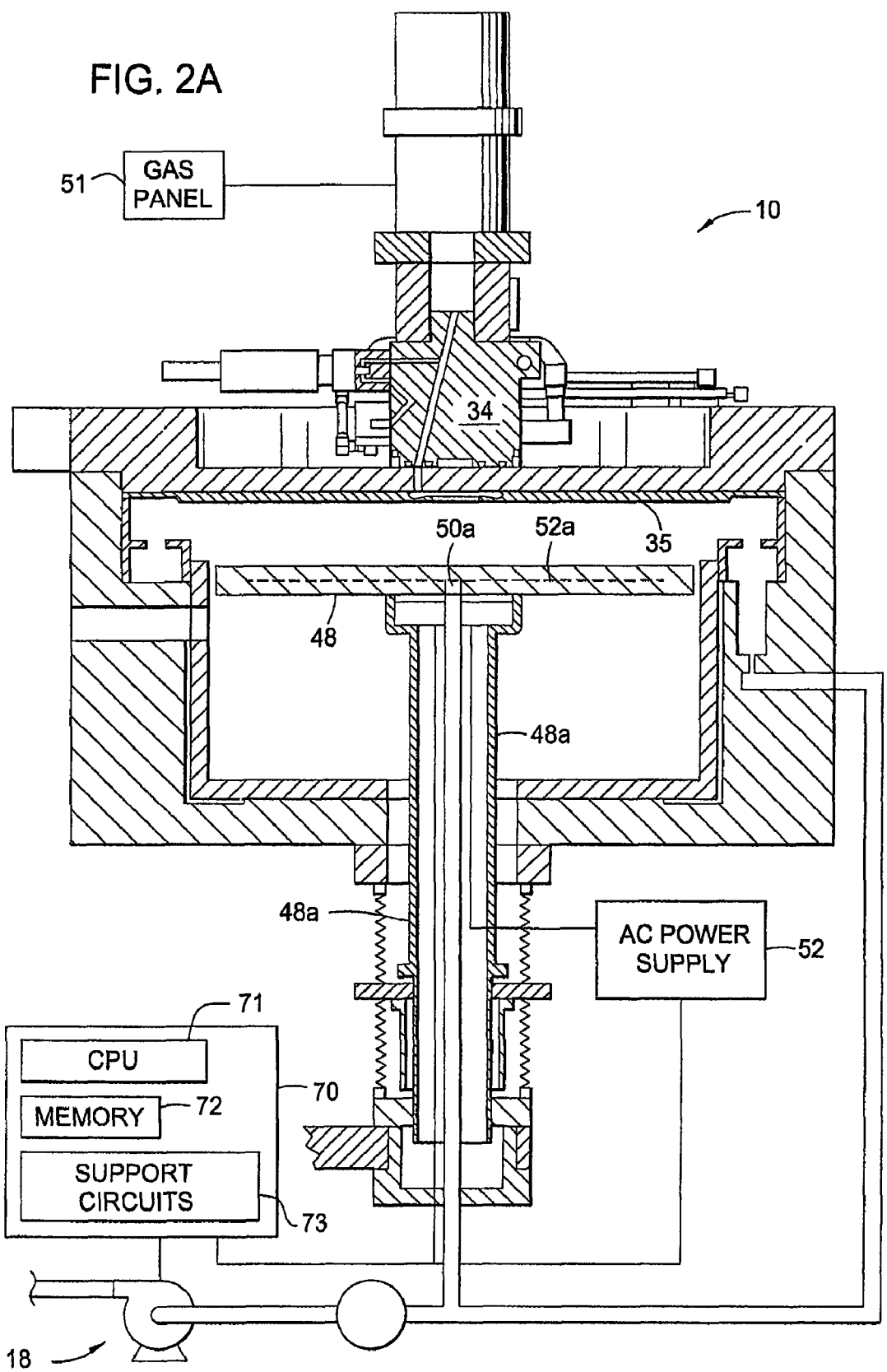
FIGS. 2A-2B depicts a schematic cross-sectional view of a process chamber and a top view of a gas distribution plate that can be used for the practice of embodiments described herein.

FIG. 2A depicts a schematic cross-sectional view of a process chamber 10 that can be used to perform deposition processes in accordance with embodiments described herein. The process chamber 10 generally houses a wafer support pedestal 48, which is used to support a substrate (not shown).

The wafer support pedestal 48 is movable in a vertical direction inside the process chamber 10 using a displacement mechanism 48a.

Depending on the specific deposition process, the substrate can be heated to some desired temperature prior to or during deposition. For example, the wafer support pedestal 48 may be heated using an embedded heater element 52a. The wafer support pedestal 48 may be resistively heated by applying an electric current from an AC power supply 52 to the heater element 52a. The substrate (not shown) is, in turn, heated by the pedestal 48. Alternatively, the wafer support pedestal 48 may be heated using radiant heaters such as, for example, lamps (not shown).

A temperature sensor 50a, such as a thermocouple, is also embedded in the wafer support pedestal 48 to monitor the temperature of the pedestal 48 in a conventional manner. The measured temperature is used in a feedback loop to control the AC power supply 52 for the heating element 52a, such that the substrate temperature can be maintained or controlled at a desired temperature which is suitable for the particular process application.

A vacuum pump 18 is used to evacuate the process chamber 10 and to maintain the pressure inside the process chamber 10. A gas manifold 34, through which process gases are introduced into the process chamber 10, is located above the wafer support pedestal 48. The gas manifold 34 is coupled to a gas panel 51, which controls and supplies various process gases to the process chamber 10.

Proper control and regulation of the gas flows to the gas manifold 34 are performed by mass flow controllers (not shown) and a microprocessor controller 70. Additionally, the gas manifold 34 may optionally be heated to prevent condensation of the reactive gases within the manifold.

Figure 2B:
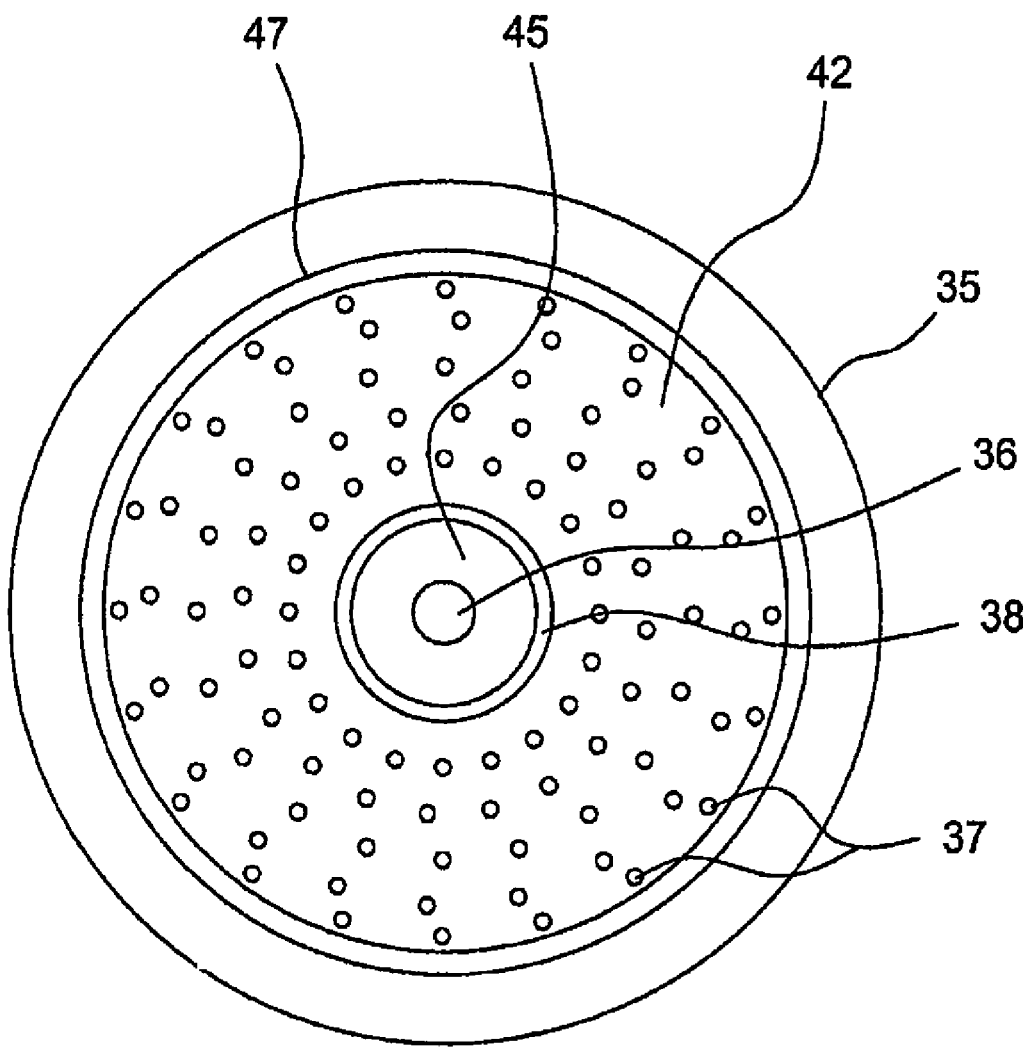

The gas manifold 34 includes a gas distribution plate 35. Referring to FIG. 2B, the gas distribution plate 35 is configured to include two gas distribution zones 42, 45 for providing process gases to the process chamber for either a chemical vapor deposition (CVD) process or a cyclical deposition process. A first gas distribution zone 45 comprises a center opening 36 through which process gases for the cyclical deposition process are provided to the process chamber. A second gas distribution zone 42 comprises a plurality of openings 37 radially dispersed around the center opening 36.

The first gas distribution zone 45 and the second gas distribution zone 42 are isolated from one another using one or more seals 38, 47 which inhibit mixing of the process gases provided thereto. The one or more seals 38, 47 may comprise any suitable material that is non-reactive with the process gases provided to the process chamber, such as, for example, an o-ring.

Figure 3:
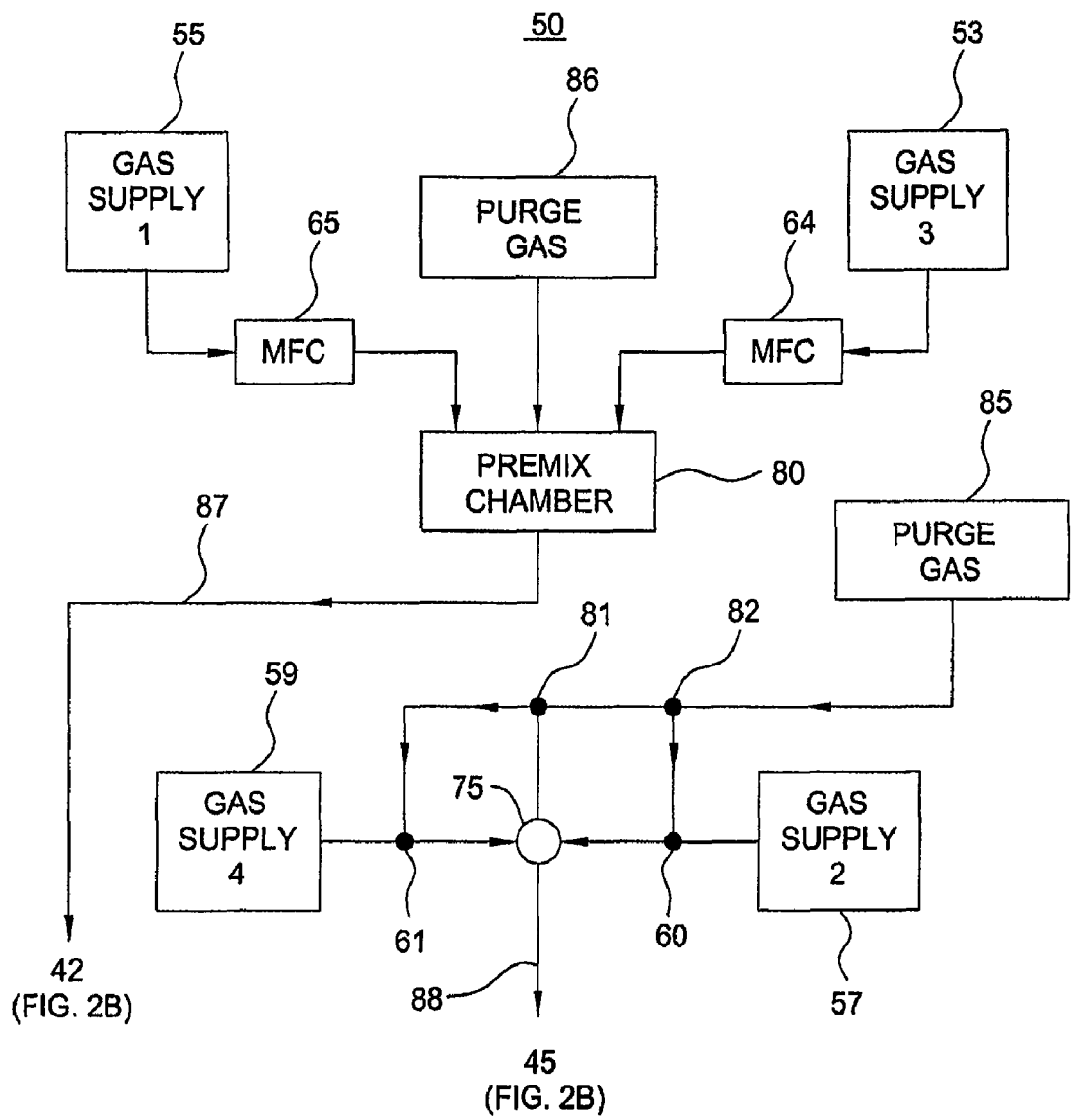
FIG. 3 is a block diagram of a gas delivery system for the gas distribution plate shown in FIG. 2B.

FIG. 3 depicts a gas distribution system 50 that may be used to provide process gases to the gas distribution plate 35 (FIG. 2A). The gas distribution system 50 includes process gas supplies 53, 55, 57, 59, purge gas supplies 85, 86, electronic control valves 60, 61, mass flow controllers (MFC) 64, 65, gas splitters 81, 82, a three-position valve 75 and a premix chamber 80.

For the cyclical deposition mode, a process gas from supplies 57, 59 is provided to electronic control valves 60, 61, respectively. A purge gas from the purge gas supply 85 may be mixed with the process gases through gas splitters 81, 82. The electronic control valves 60, 61 as used herein refer to any control valve capable of providing rapid and precise gas flow to the process chamber 10 with valve open and close cycles of less than about 1-2 seconds, and more preferably less than about 0.1 second. The electronic control valves 60, 61 are coupled to the center opening 36 in the first gas distribution zone 45, via three-position valve 75 and gas line 88.

For the chemical vapor deposition (CVD) mode, process gases from gas supplies 53, 55 are coupled through mass flow controllers (MFC) 64, 65, respectively, to premix chamber 80. A purge gas from purge gas supply 86 may also be provided to the premix chamber 80. In the premix chamber 80, the process gases are caused to mix. Generally, these gases are reactants that will react when they are exposed to a heated substrate. The mixed gases are provided from the premix chamber 80 to the plurality of openings 37 in the second gas distribution zone 42 via gas line 87.

The microprocessor controller 70 may be one of any form of general purpose computer processor (CPU) 71 that can be used in an industrial setting for controlling various chambers and sub-processors. The computer may use any suitable memory 72, such as random access memory, read only memory, floppy disk drive, hard disk, or any other form of digital storage, local or remote. Various support circuits 73 may be coupled to the CPU for supporting the processor in a conventional manner. Software routines as required may be stored in the memory or executed by a second CPU that is remotely located.

The software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to embodiments described herein. Alternatively, the software routines may be performed in hardware, as an application specific integrated circuit or other type of hardware implementation, or a combination of software and hardware.

Integrated Barrier Layer Formation

A dual-mode deposition process for forming an integrated barrier layer structure on a substrate is described. The dual-mode deposition process is performed in a single deposition chamber and comprises a chemical vapor deposition (CVD) step as well as a cyclical deposition step.

Figure 4:
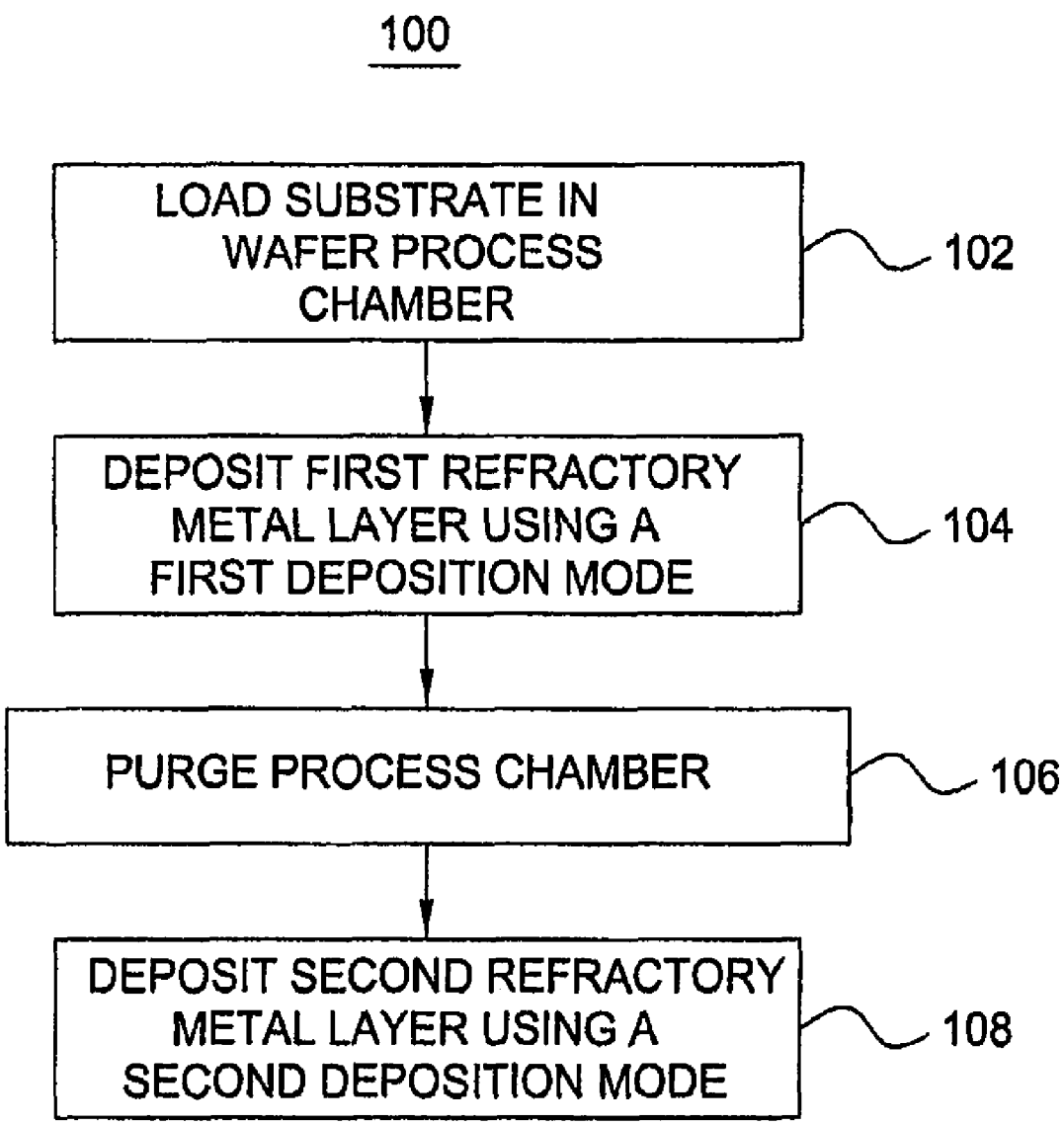
FIG. 4 illustrates a process sequence for integrated barrier layer formation.

FIG. 4 illustrates an embodiment of the dual-mode deposition process sequence 100 detailing the various steps used for the formation of the integrated barrier layer structure. The integrated barrier layer comprises at least a first refractory metal layer and a second refractory metal layer. The dual-mode deposition process may be performed in a process chamber similar to that described above with respect to FIGS. 2-3.

As indicated in step 102, a substrate is provided to the process chamber. The substrate may be for example, a silicon substrate having gate regions formed thereon. Referring to step 104, a first refractory metal layer is formed on the substrate using a first deposition mode. The first deposition mode may comprise, for example, a chemical vapor deposition process wherein a refractory metal-containing precursor is thermally decomposed.

The first refractory metal layer may comprise for example titanium (Ti), titanium nitride (TiN), tantalum (Ta), or tantalum nitride (TaN), among others. Suitable titanium-containing precursors for a CVD process may include, for example, titanium tetrachloride ($TiCl_4$), tetrakis(dimethylamido)titanium (TDMAT) and tetrakis(diethylamido)titanium (TDEAT), among others. Suitable tantalum-containing precursors for a CVD process may include, for example, pentakis (dimethylamido)tantalum (PDMAT), pentakis(ethylmethylamido)tantalum (PEMAT), tertbutylimidotris (diethylamido)tantalum (TBTDET), and pentakis (diethylamido)tantalum (PDEAT), among others.

One exemplary process of depositing a titanium nitride (TiN) layer using a chemical vapor deposition (CVD) process comprises thermally decomposing a titanium-containing precursor such as, for example, tetrakis(dimethylamido)titanium (TDMAT). The tetrakis(dimethylamido)titanium (TDMAT) may be provided to radially dispersed openings 37 (FIG. 2B) of the distribution plate 35 (FIG. 2B) in the process chamber at a flow rate between about 20 sccm to about 200 sccm, preferably between about 50 sccm to about 100 sccm. A carrier gas comprising helium (He) may be provided along with the tetrakis(dimethylamido)titanium (TDMAT) at a flow rate between about 500 sccm to about 2000 sccm, preferably between about 1000 sccm to about 1500 sccm. The substrate may be maintained at a temperature between about 200° C. to about 400° C., preferably between about 300° C. to about 350° C., at a chamber pressure between about 5 torr to about 15 torr, preferably about 10 torr.

Referring to step 106, after the first refractory metal layer is formed on the substrate using a first deposition mode, the process chamber is purged to remove any process gases remaining therein. Suitable purge gases may include argon (Ar), helium (He) and nitrogen ($N_2$). Thereafter, a second refractory metal layer is formed on the first refractory metal layer using a second deposition mode, as indicated in step 108. The second refractory metal layer may be formed using a cyclical deposition process by alternately adsorbing a refractory metal-containing precursor and a reducing gas on the substrate.

Figure 5:
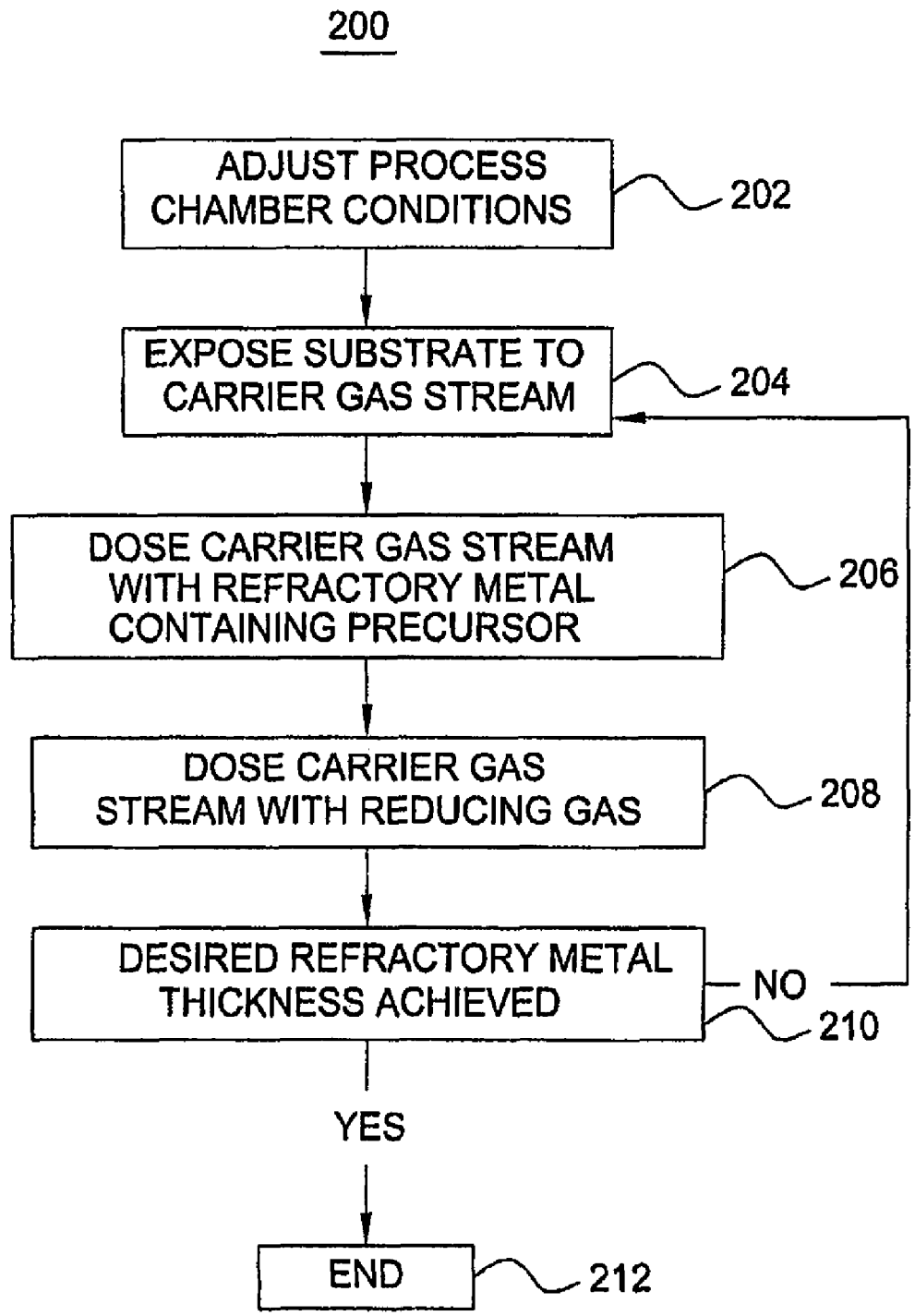
FIG. 5 illustrates a process sequence for material layer formation using cyclical deposition techniques according to one embodiment described herein.

FIG. 5 illustrates an embodiment of a cyclical deposition process sequence 200 according to the present invention detailing the various steps used for the deposition of the second refractory metal layer. As shown in step 202, the process chamber conditions such as, for example, the temperature and pressure are adjusted to enhance the adsorption of the process gases on the substrate.

In one embodiment where a constant carrier gas flow is desired, a carrier gas stream is established within the process chamber through the center opening 36 (FIG. 2B) in the gas distribution plate 35 (FIG. 2B), as indicated in step 204. Carrier gases may be selected so as to also act as a purge gas for removal of volatile reactants and/or by-products from the process chamber. Carrier gases such as, for example, helium (He), argon (Ar), nitrogen ($N_2$) and hydrogen ($H_2$), and combinations thereof, among others may be used.

Referring to step 206, after the carrier gas stream is established within the process chamber, a pulse of a refractory metal-containing precursor is added to the carrier gas stream. The term pulse as used herein refers to a dose of material injected into the process chamber or into the carrier gas stream. The pulse of the refractory metal-containing precursor lasts for a predetermined time interval.

The second refractory metal layer may comprise for example, tungsten (W), tungsten nitride (WN), or tungsten boride ($W_2B$), among others. Suitable tungsten-containing precursors may include, for example, tungsten hexafluoride ($WF_6$) and tungsten carbonyl ($W(CO)_6$), among others The time interval for the pulse of the refractory metal-containing precursor is variable depending on a number of factors such as, for example, the volume capacity of the process chamber employed, the vacuum system coupled thereto and the volatility/reactivity of the reactants used. For example, (1) a large-volume process chamber may lead to a longer time to stabilize the process conditions such as, for example, carrier purge gas flow and temperature, requiring a longer pulse time; and (2) a lower flow rate for the process gas may also lead to a longer time to stabilize the process conditions requiring a longer pulse time. In general, the process conditions are advantageously selected so that a pulse of the refractory metal-containing precursor provides a sufficient amount of precursor, such that at least a monolayer of the refractory metal-containing precursor is adsorbed on the substrate. Thereafter, excess refractory metal-containing precursor remaining in the chamber may be removed from the process chamber by the carrier gas stream in combination with the vacuum system.

In step 208, after the excess refractory metal-containing precursor has been sufficiently removed from the process chamber by the carrier gas stream to prevent co-reaction or particle formation with a subsequently provided process gas, a pulse of a reducing gas is added to the carrier gas stream. Suitable reducing gases may include for example, silane ($SiH_4$), disilane ($Si_2H_6$), dichlorosilane ($SiCl_2H_2$), ammonia ($NH_3$), hydrazine ($N_2H_4$), monomethyl hydrazine ($CH_3N_2H_3$), dimethyl hydrazine ($C_2H_6N_2H_2$), t-butyl hydrazine ($C_4H_9N_2H_3$), phenyl hydrazine ($C_6H_5N_2H_3$), 2,2'-azoisobutane (($CH_3)_6C_2N_2$), ethylazide ($C_2H_5N_3$), borane ($BH_3$), diborane ($B_2H_6$), triborane ($B_3H_9$), tetraborane ($B_4H_{12}$), pentaborane ($B_5H_{15}$), hexaborane ($B_6H_{18}$), heptaborane ($B_7H_{21}$), octaborane ($B_8H_{24}$), nanoborane ($B_9H_{27}$) and decaborane ($B_{10}H_{30}$), among others.

The pulse of the reducing gas also lasts for a predetermined time interval. In general, the time interval for the pulse of the reducing gas should be long enough to provide a sufficient amount of the reducing gas for reaction with the refractory metal-containing precursor that is already adsorbed on the substrate. Thereafter, excess reducing gas is flushed from the process chamber by the carrier gas stream in combination with the vacuum system.

Steps 204 through 208 comprise one embodiment of a deposition cycle for the second refractory metal-containing layer. For such an embodiment, a constant flow of the carrier gas is provided to the process chamber modulated by alternating periods of pulsing and non-pulsing where the periods of pulsing alternate between the refractory metal-containing precursor and the reducing gas along with the carrier gas stream, while the periods of non-pulsing include only the carrier gas stream.

The time interval for each of the pulses of the refractory metal-containing precursor and the reducing gas may have the same duration. That is the duration of the pulse of the refractory metal-containing precursor may be identical to the duration of the pulse of the reducing gas. For such an embodiment, a time interval ($T_1$) for the pulse of the refractory metal-containing precursor equals a time interval ($T_2$) for the pulse of the reducing gas.

Alternatively, the time interval for each of the pulses of the refractory metal-containing precursor and the reducing gas may have different durations. That is the duration of the pulse of the refractory metal-containing precursor may be shorter or longer than the duration of the pulse of the reducing gas. For such an embodiment, a time interval ($T_1$) for the pulse of the refractory metal-containing precursor is different than a time interval ($T_2$) for the pulse of the reducing gas.

In addition, the periods of non-pulsing between each of the pulses of the refractory metal-containing precursor and the reducing gas may have the same duration. That is, the duration of the period of non-pulsing between each pulse of the refractory metal-containing precursor and each pulse of the reducing gas is identical. For such an embodiment, a time interval ($T_3$) of non-pulsing between the pulse of the refractory metal-containing precursor and the pulse of the reducing gas equals a time interval ($T_4$) of non-pulsing between the pulse of the reducing gas and the pulse of the refractory metal-containing precursor. During the time periods of non-pulsing only the constant carrier gas stream is provided to the process chamber.

Alternatively, the periods of non-pulsing between each of the pulses of the refractory metal-containing precursor and the reducing gas may have different durations. That is, the duration of the period of non-pulsing between each pulse of the refractory metal-containing precursor and each pulse of the reducing gas may be shorter or longer than the duration of the period of non-pulsing between each pulse of the reducing gas and the pulse of the refractory metal-containing precursor. For such an embodiment, a time interval ($T_3$) of non-pulsing between the pulse of the refractory metal-containing precursor and the pulse of the reducing gas is different from a time interval ($T_4$) of non-pulsing between the pulse of the reducing gas and the pulse of the refractory metal-containing precursor. During the time periods of non-pulsing only the constant carrier gas stream is provided to the process chamber.

Additionally, the time intervals for each pulse of the refractory metal-containing precursor, the reducing gas and the periods of non-pulsing therebetween for each deposition cycle may have the same duration. For such an embodiment, a time interval ($T_1$) for the pulse of the refractory metal-containing precursor, a time interval ($T_2$) for the pulse of the reducing gas, a time interval ($T_3$) of non-pulsing between the pulse of the refractory metal-containing precursor and the pulse of the reducing gas and a time interval ($T_4$) of non-pulsing between the pulse of the reducing gas and the pulse of the refractory metal-containing precursor, each have the same value for each subsequent deposition cycle. For example, in a first deposition cycle ($C_1$), a time interval ($T_1$) for the pulse of the refractory metal-containing precursor has the same duration as the time interval ($T_1$) for the pulse of the refractory metal-containing precursor in subsequent deposition cycles ($C_2 \ldots C_N$). Similarly, the duration of each pulse of the reducing gas as well as the periods of non-pulsing between the pulse of the refractory metal-containing precursor and the reducing gas in the first deposition cycle ($C_1$) is the same as the duration of each pulse of the reducing gas and the periods of non-pulsing between the pulse of the refractory metal-containing precursor and the reducing gas in subsequent deposition cycles ($C_2 \ldots C_N$), respectively.

Alternatively, the time intervals for at least one pulse of the refractory metal-containing precursor, the reducing gas and the periods of non-pulsing therebetween for one or more of the deposition cycles of the second refractory metal layer may have different durations. For such an embodiment, one or more of the time intervals ($T_1$) for the refractory metal-containing precursor, the time intervals ($T_2$) for the reducing gas, the time intervals ($T_3$) of non-pulsing between the pulse of the refractory metal-containing precursor and the pulse of the reducing gas and the time interval ($T_4$) of non-pulsing between the pulse of the reducing gas and the pulse of the refractory metal-containing precursor may have different values for one or more subsequent deposition cycles of the cyclical deposition process. For example, in a first deposition cycle ($C_1$), the time interval ($T_1$) for the pulse of the refractory metal-containing precursor may be longer or shorter than the time interval ($T_1$) for the pulse of the refractory metal-containing precursor in subsequent deposition cycles ($C_2 \ldots C_N$). Similarly, the duration of each pulse of the reducing gas and the periods of non-pulsing between the pulse of the refractory metal-containing precursor and the reducing gas in deposition cycle ($C_1$) may be the same or different than the duration of corresponding pulses of the reducing gas and the periods of non-pulsing between the pulse of the refractory metal-containing precursor and the reducing gas in subsequent deposition cycles ($C_2 \ldots C_N$), respectively.

Referring to step 210, after each deposition cycle (steps 204 through 208) a total thickness of the second refractory metal will be formed on the substrate. Depending on specific device requirements, subsequent deposition cycles may be needed to achieve a desired thickness. As such, steps 204 through 208 are repeated until the desired thickness for the second refractory metal layer is achieved. Thereafter, when the desired thickness for the second refractory metal layer is achieved the process is stopped as indicated by step 212.

Figure 6:
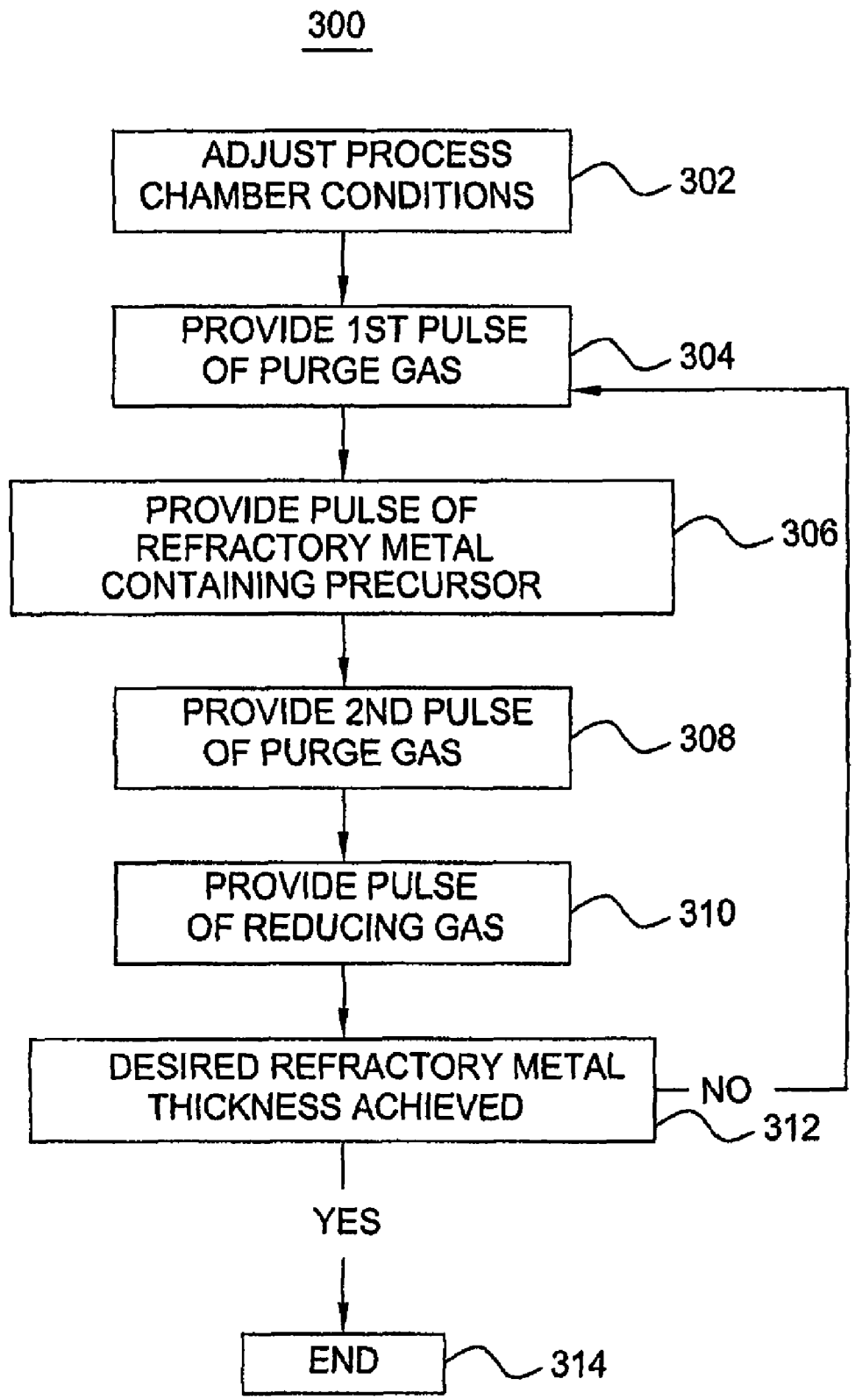
FIG. 6 illustrates a process sequence for material layer formation using cyclical deposition techniques according to an alternate embodiment described herein.

In an alternate process sequence described with respect to FIG. 6, the second refractory metal layer deposition cycle comprises separate pulses for each of the refractory metal-containing precursor, the reducing gas and a purge gas. For such an embodiment, a refractory metal layer deposition sequence 300 includes adjusting the process chamber conditions (step 302), providing a first pulse of a purge gas to the process chamber (step 304), providing a pulse of a refractory metal-containing precursor to the process chamber (step 306), providing a second pulse of a purge gas to the process chamber (step 308), providing a pulse of the reducing gas to the process chamber (step 310), and then repeating steps 304 through 308, or stopping the deposition process (step 314) depending on whether a desired thickness for the refractory metal layer has been achieved (step 312).

The time intervals for each of the pulses of the refractory metal-containing precursor, the reducing gas and the purge gas may have the same or different durations as discussed above with respect to FIG. 5. Alternatively, corresponding time intervals for one or more pulses of the refractory metal-containing precursor, the reducing gas and the purge gas in one or more of the deposition cycles of the refractory metal layer deposition process may have different durations.

In FIGS. 5-6, the refractory metal layer deposition cycle is depicted as beginning with a pulse of the refractory metal-containing precursor followed by a pulse of the reducing gas. Alternatively, the refractory metal layer deposition cycle may start with a pulse of the reducing gas followed by a pulse of the refractory metal-containing precursor.

One exemplary process of depositing a tungsten layer comprises sequentially providing pulses of tungsten hexafluoride ($WF_6$) and pulses of diborane ($B_2H_6$). The tungsten hexafluoride ($WF_6$) may be provided to an appropriate flow control valve, for example, an electronic control valve, at a flow rate of between about 10 sccm (standard cubic centimeters per minute) and about 400 sccm, preferably between about 20 sccm and about 100 sccm, and thereafter pulsed for about 1 second or less, preferably about 0.2 seconds or less. A carrier gas comprising argon (Ar) is provided along with the tungsten hexaflouride ($WF_6$) at a flow rate between about 250 sccm to about 1000 sccm, preferably between about 500 sccm to about 750 sccm. The diborane ($B_2H_6$) may be provided to an appropriate flow control valve, for example, an electronic control valve, at a flow rate of between about 5 sccm and about 150 sccm, preferably between about 5 sccm and about 25 sccm, and thereafter pulsed for about 1 second or less, preferably about 0.2 seconds or less. A carrier gas comprising argon (Ar) is provided along with the diborane ($B_2H_6$) at a flow rate between about 250 sccm to about 1000 sccm, preferably between about 500 sccm to about 750 sccm. The substrate may be maintained at a temperature between about 250° C. and about 350° C., preferably about 300° C. at a chamber pressure between about 1 torr to about 10 torr, preferably about 5 torr.

Another exemplary process of depositing a tungsten layer comprises sequentially providing pulses of tungsten hexaflouride ($WF_6$) and pulses of silane ($SiH_4$). The tungsten hexafluoride ($WF_6$) may be provided to an appropriate flow control valve, for example, an electronic control valve, at a flow rate of between about 10 sccm (standard cubic centimeters per minute) and about 400 sccm, preferably between about 20 sccm and about 100 sccm, and thereafter pulsed for about 1 second or less, preferably about 0.2 seconds or less. A carrier gas comprising argon (Ar) is provided to along with the tungsten hexaflouride ($WF_6$) at a flow rate between about 250 sccm to about 1000 sccm, preferably between about 300 sccm to about 500 sccm. The silane ($SiH_4$) may be provided to an appropriate flow control valve, for example, an electronic control valve, at a flow rate between about 10 sccm to about 500 sccm, preferably between about 50 sccm to about 200 sccm, and thereafter pulsed for about 1 second or less, preferably about 0.2 seconds or less. A carrier gas comprising argon (Ar) is provided along with the silane ($SiH_4$) at a flow rate between about 250 sccm to about 1000 sccm, preferably between about 300 scorn to about 500 sccm. A pulse of a purge gas comprising agron (Ar) at a flow rate between about 300 sccm to about 1000 sccm, preferably between about 500 sccm to about 750 sccm, in pulses of about 1 second or less, preferably about 0.3 seconds or less is provided between the pulses of the tungsten hexafluoride ($WF_6$) and the pulses of silane ($SiH_4$). The substrate may be maintained at a temperature between about 300° C. to about 400° C., preferably about 350° C., at a chamber pressure between about 1 torr to about 10 torr.

Referring to FIG. 4, the dual-mode deposition process is depicted as forming the first refractory metal layer using a chemical vapor deposition (CVD) process followed by formation of the second refractory metal layer using a cyclical deposition process. Alternatively, the dual-mode deposition process may start with a first refractory metal layer deposited using a cyclical deposition process followed by a second refractory metal layer deposited using a chemical vapor deposition (CVD) process.

Integrated Circuit Fabrication Processes

1. Copper Interconnects

Figure 7A:
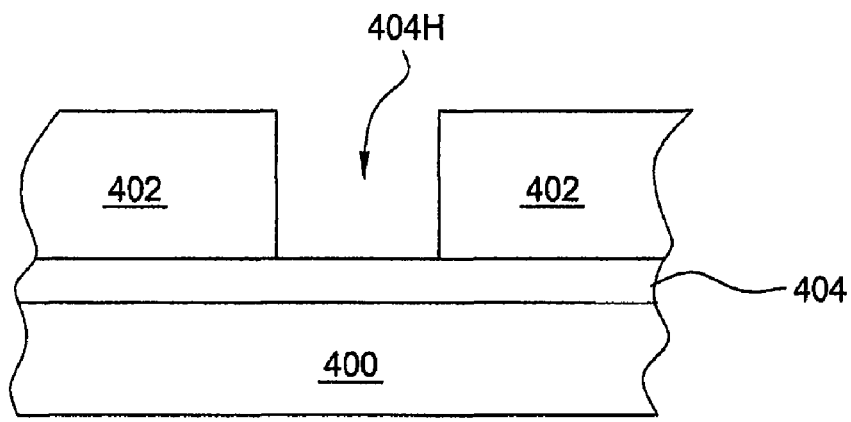
FIGS. 7A-7C illustrate schematic cross-sectional views of a substrate at different stages of an interconnect fabrication sequence.
Figure 7B:
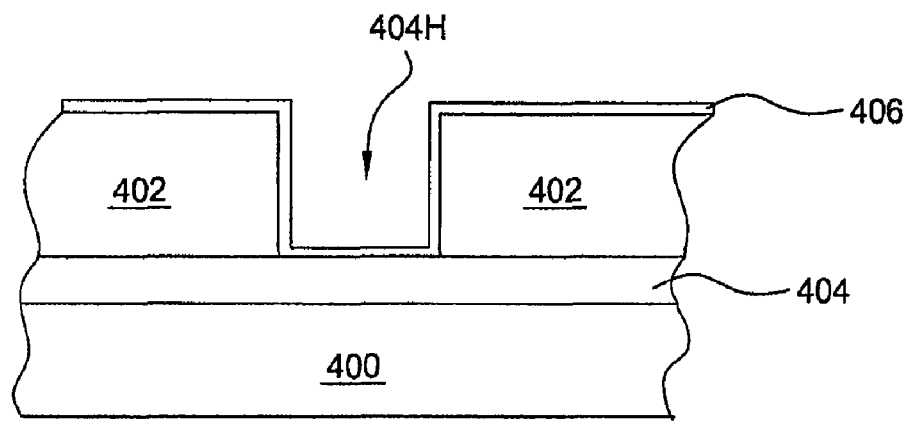
Figure 7C:
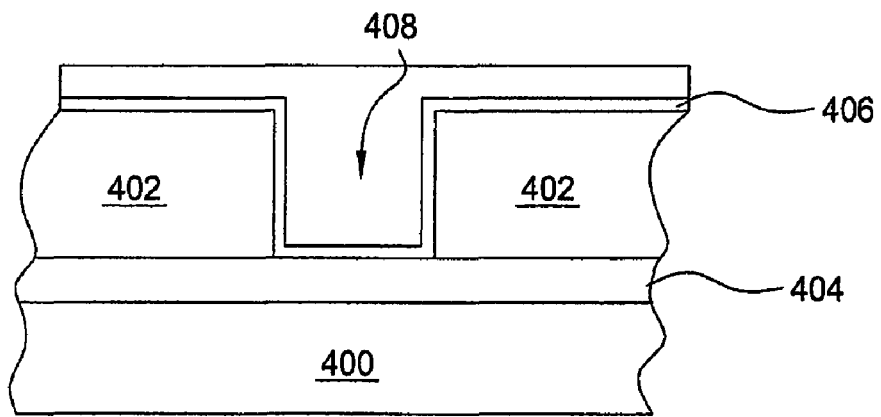

FIGS. 7A-7C illustrate cross-sectional views of a substrate at different stages of a copper interconnect fabrication sequence incorporating the integrated barrier layer of the present invention. FIG. 7A, for example, illustrates a cross-sectional view of a substrate 400 having metal contacts 404 and a dielectric layer 402 formed thereon. The substrate 400 may comprise a semiconductor material such as, for example, silicon (Si), germanium (Ge), or gallium arsenide (GaAs). The dielectric layer 402 may comprise an insulating material such as, for example, silicon oxide or silicon nitride. The metal contacts 404 may comprise for example, copper (Cu). Apertures 404H may be defined in the dielectric layer 402 to provide openings over the metal contacts 404. The apertures 404H may be defined in the dielectric layer 402 using conventional lithography and etching techniques.

Referring to FIG. 7B, an integrated barrier layer 406 is formed in the apertures 404H defined in the dielectric layer 402. The integrated barrier layer 406 comprises a titanium nitride (TiN) layer formed with a chemical vapor deposition (CVD) process and a tungsten (W) layer formed with a cyclical deposition process. The integrated barrier layer 406 is formed using the deposition techniques described above with respect to FIGS. 4-6. The thickness of the integrated barrier layer 406 is typically about 20 Å to about 500 Å.

Thereafter, the apertures 404H are filled with copper (Cu) metallization 408 using a suitable deposition process as shown in FIG. 7C. For example, copper (Cu) may be deposited with a chemical vapor deposition (CVD) process using copper-containing precursors such as $Cu^{+2}(hfac)_2$ (copper hexafluoro acetylacetonate), $Cu^{+2}(fod)_2$ (copper heptafluoro dimethyl octanediene), $Cu^{+1}hfac$ TMVS (copper hexafluoro acetylacetonate trimethylvinylsilane), among others.

2. Gate Electrodes

Figure 8A:
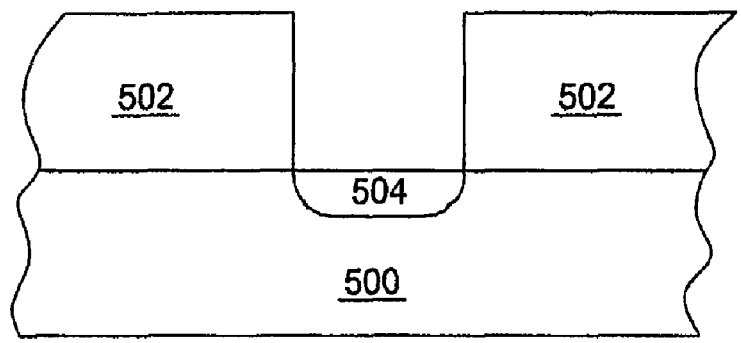
FIGS. 8A-8C illustrate schematic cross-sectional views of a substrate at different stages of a gate electrode fabrication sequence.
Figure 8B:
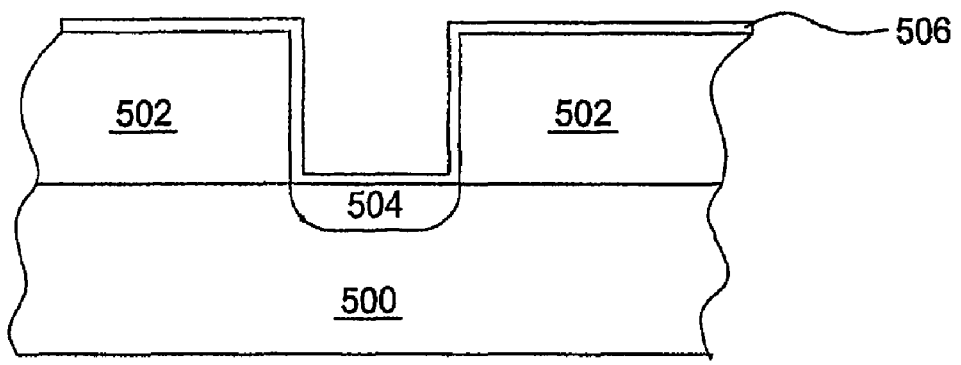
Figure 8C:
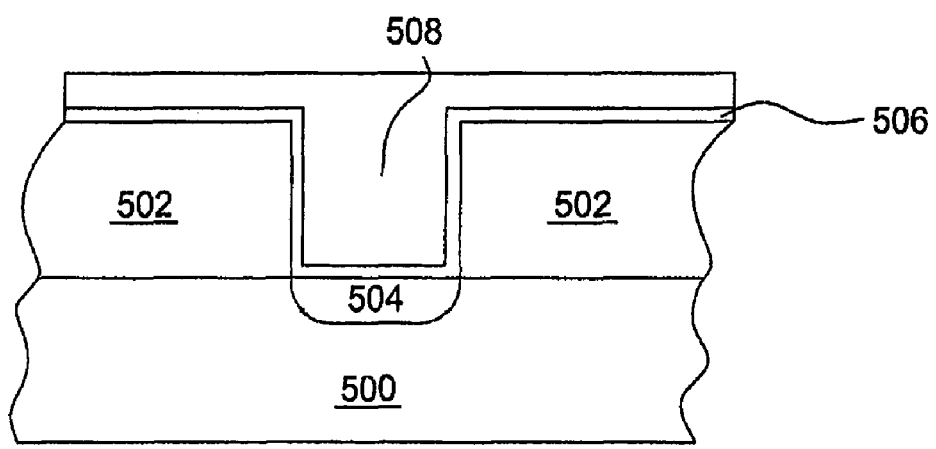

FIGS. 8A-8C illustrate cross-sectional views of a substrate at different stages of a gate electrode fabrication sequence incorporating the integrated barrier layer of the present invention. FIG. 8A, for example, illustrates a cross-sectional view of a substrate 500 having gate regions 504 formed on the surface thereof. The gate regions 504 are surrounded by a dielectric material 502. The substrate 500 may comprise a semiconductor material such as, for example, silicon (Si), germanium (Ge), or gallium arsenide (GaAs). The dielectric material 502 may comprise an insulating material such as, for example, silicon oxide or silicon nitride.

Referring to FIG. 8B, an integrated barrier layer 506 is formed on the gate regions 504. The integrated barrier layer 506 comprises a titanium nitride (TiN) layer formed with a chemical vapor deposition (CVD) process and a tungsten (W) layer formed with a cyclical deposition process. The integrated barrier layer 506 is formed using the deposition techniques described above with respect to FIGS. 4-6. The thickness of the integrated barrier layer 506 is typically about 20 Å to about 500 Å.

Thereafter, the gate electrodes are completed by depositing gate metallization 508 on the integrated barrier layer 506 as shown in FIG. 8C. The gate metallization may comprise tungsten (W), aluminum (Al) or copper (Cu), among others. For example, tungsten (W) may be deposited with a chemical vapor deposition (CVD) process from the thermal decomposition of tungsten hexafluoride ($WF_6$) or tungsten carbonyl ($W(CO)_6$); aluminum may be deposited with a chemical vapor deposition (CVD) process using dimethyl aluminum hydride (DMAH); or copper (Cu) may be deposited with a chemical vapor deposition (CVD) process using copper-containing precursors such as $Cu^{+2}(hfac)_2$ (copper hexafluoro acetylacetonate), $Cu^{+2}(fod)_2$ (copper heptafluoro dimethyl octanediene), or $Cu^{+1}hfac$ TMVS (copper hexafluoro acetylacetonate trimethylvinylsilane), among others.

3. Trench Capacitors

Figure 9A:
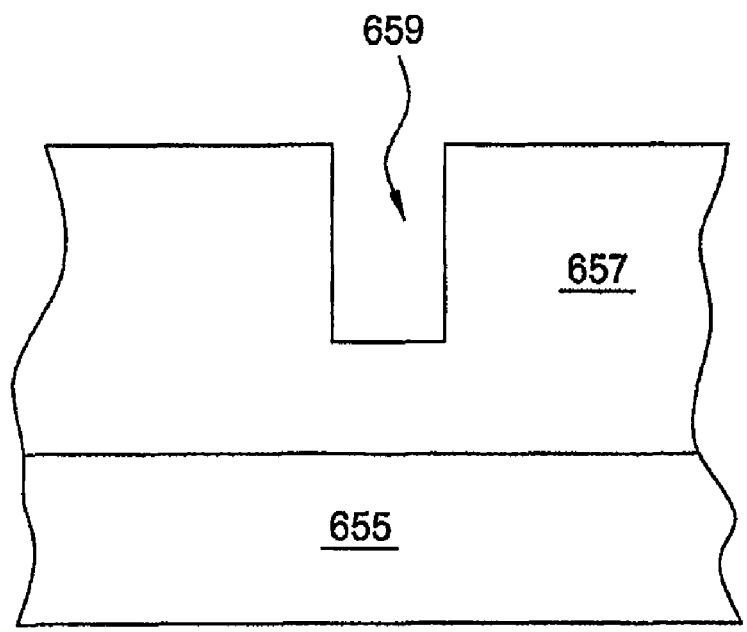
FIGS. 9A-9D illustrate schematic cross-sectional views of a substrate at different stages of a trench capacitor fabrication sequence.

FIGS. 9A-9D are illustrative of a metal-insulator-metal (MIM) trench capacitor fabrication sequence incorporating the integrated barrier layer of the present invention. FIG. 9A, for example, illustrates a cross-sectional view of a substrate 655 having a dielectric material layer 657 formed thereon. The substrate 655 may comprise a semiconductor material such as, for example, silicon (Si), germanium (Ge), or gallium arsenide (GaAs). The dielectric material layer 657 may comprise an insulator such as, for example, silicon oxide or silicon nitride. At least one trench 659 is defined in the dielectric material layer 657. The trench may be formed using conventional lithography and etching techniques.

Figure 9B:
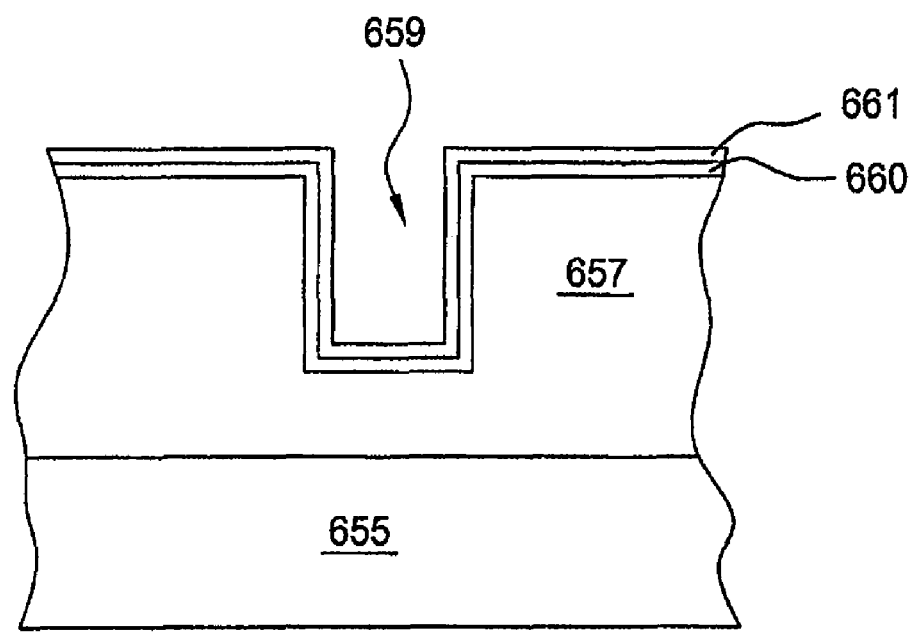

Referring to FIG. 9B, a first integrated barrier layer 660 is formed on the trench 659. The first integrated barrier layer 660 comprises a titanium nitride (TiN) layer formed with a chemical vapor deposition (CVD) process and a tungsten (W) layer formed with a cyclical deposition process. The first integrated barrier layer 660 is formed using the deposition techniques described above with respect to FIGS. 4-6. The thickness of the integrated barrier layer 660 is typically about 20 Å to about 500 Å.

A first metal layer 661 is formed over the first integrated barrier layer 660. The first metal layer 661 comprises the first electrode of the metal-insulator-metal (MIM) trench capacitor. A suitable metal for the first metal layer 661 includes, for example, tungsten (W). The thickness of the first metal layer 661 is typically about 100 Å to about 1000 Å.

Figure 9C:
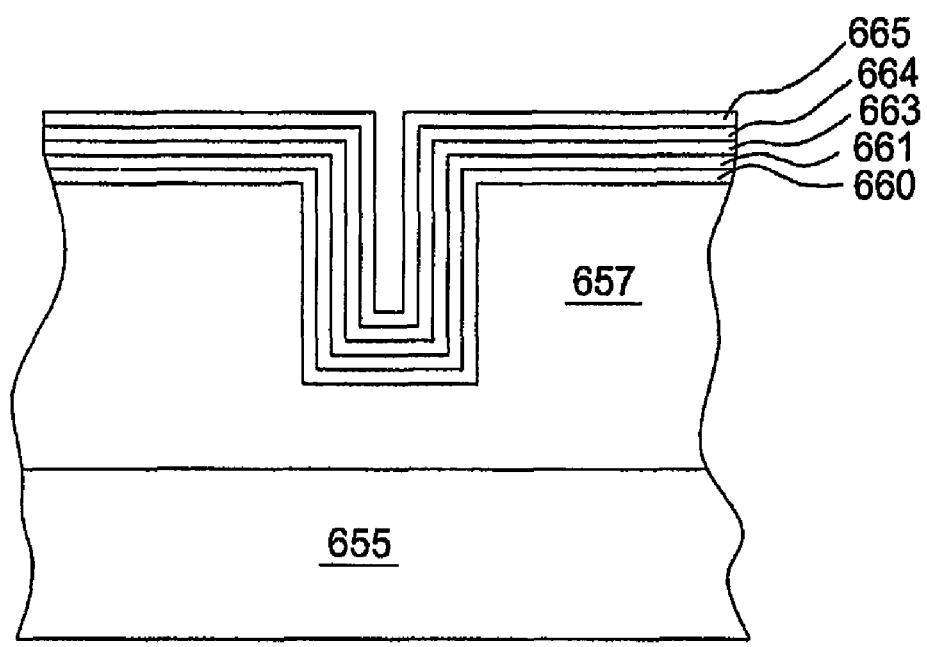

The trench capacitor further includes an insulating layer 663 formed over the metal layer 661, as shown in FIG. 9C. The insulating layer 663 preferably comprises a high dielectric constant material (dielectric constant greater then about 10). High dielectric constant materials advantageously permit higher charge storage capacities for the capacitor structures. Suitable dielectric materials may include for example, tantalum pentoxide ($Ta_2O_5$), silicon oxide/silicon nitride/oxynitride (ONO), aluminum oxide ($Al_2O_3$), barium strontium titanate (BST), barium titanate, lead zirconate titanate (PZT), lead lanthanium titanate, strontium titanate and strontium bismuth titanate, among others.

The thickness of the insulating layer 663 is variable depending on the dielectric constant of the material used and the geometry of the device being fabricated. Typically, the insulating layer 663 has a thickness of about 100 Å to about 1000 Å.

A second integrated barrier layer 664 is formed on the insulating layer 663. The second integrated barrier layer 664 comprises a titanium nitride (TiN) layer formed with a chemical vapor deposition (CVD) process and a tungsten (W) layer formed with a cyclical deposition process. The second integrated barrier layer 664 is formed using the deposition techniques described above with respect to FIGS. 4-6. The thickness of the integrated barrier layer 664 is typically about 20 Å to about 500 Å.

A second metal layer 665 is formed over the second integrated barrier layer 664. The second metal layer 665 comprises the second electrode of the metal-insulator-metal (MIM) trench capacitor. A suitable metal for the second metal layer 665 includes, for example, tungsten (W). The thickness of the second metal layer 665 is typically about 100 Å to about 1000 Å.

Figure 9D:
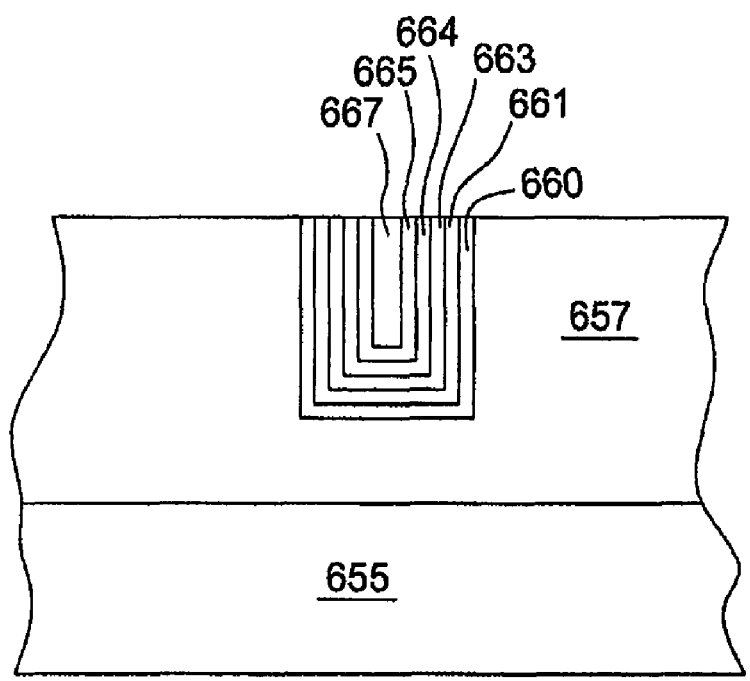

After the second metal layer 665 is formed, the metal-insulator-metal (MIM) trench capacitor is completed by filling the trench 659 with, for example, a polysilicon layer 667, as shown in FIG. 9D. The polysilicon layer 667 may be formed using conventional deposition techniques. For example, the polysilicon layer 667 may be deposited using a chemical vapor deposition (CVD) process in which silane ($SiH_4$) is thermally decomposed to form polysilicon at a temperature between about 550° C. and 700° C.

4. Crown Capacitors

Figure 10A:
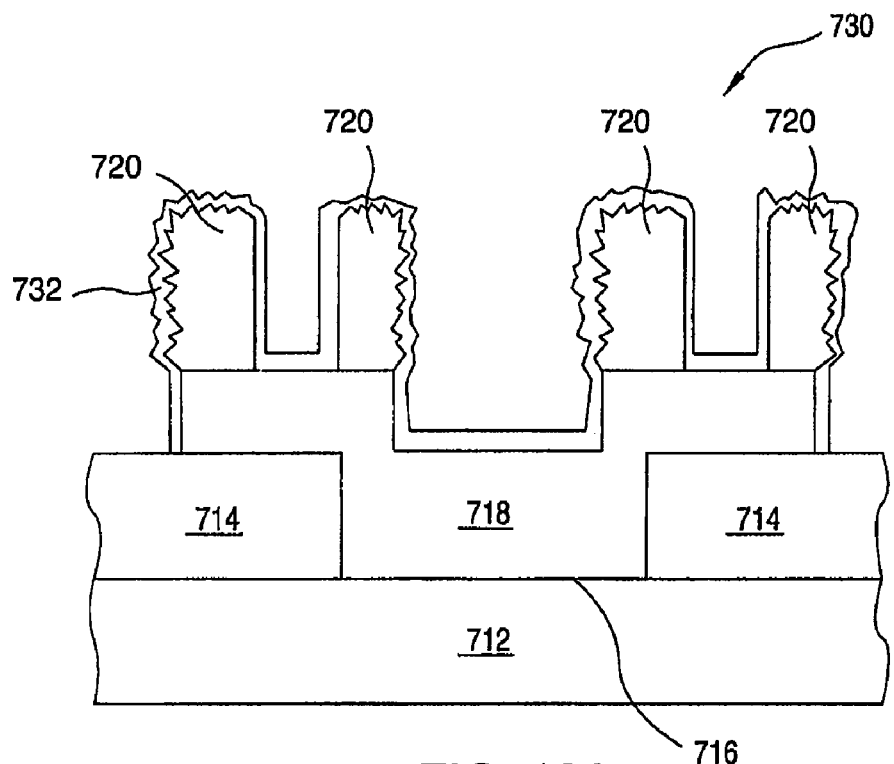
FIGS. 10A-10B depict cross-sectional views of a substrate at different stages of a crown capacitor fabrication sequence.
Figure 10B:
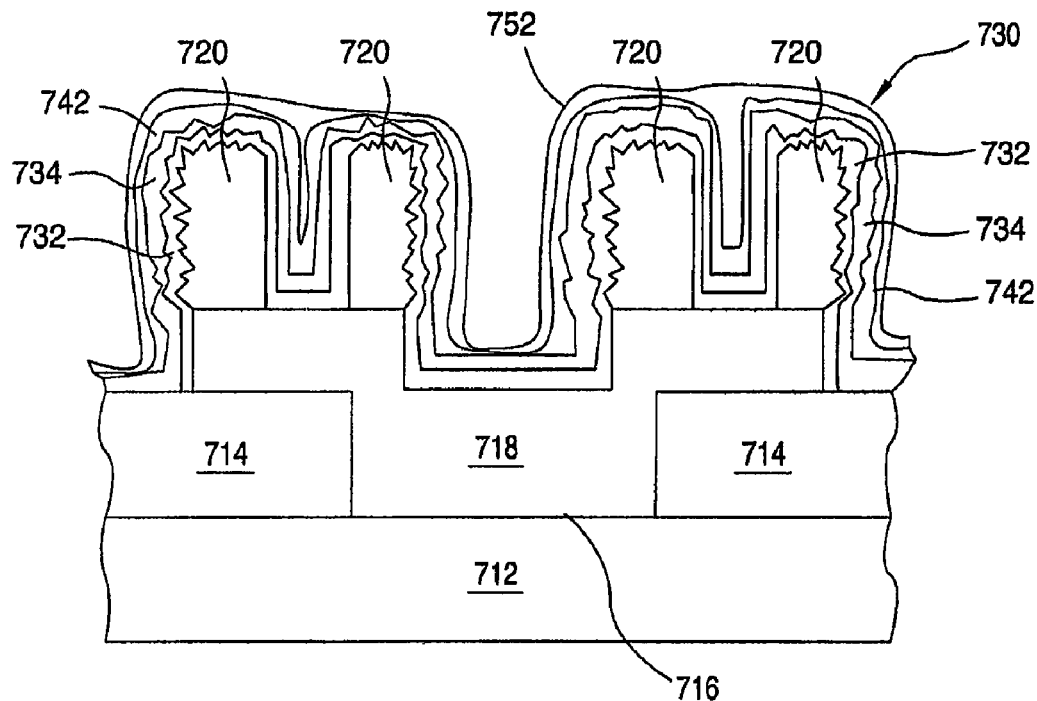

FIGS. 10A-10B illustrate cross-sectional views of a substrate at different stages of a crown capacitor fabrication sequence incorporating the integrated barrier layer of the present invention. The term crown capacitor as used herein refers to a capacitor structure having a three-dimensional shape formed above the surface of the substrate. The three-dimensional shape increases the capacitance of the device by increasing the surface area thereof.

FIG. 10A, for example, illustrates a cross-sectional view of a substrate 712 having a dielectric layer 714 formed thereon. The substrate 712 may comprise a semiconductor material such as, for example, silicon (Si), germanium (Ge), or gallium arsenide (GaAs). The dielectric 714 may comprise an oxide such as, for example, a silicon oxide. The dielectric layer 714 has at least one aperture 716 formed therein.

A first polysilicon layer 718 is formed over the dielectric layer 714 and the at least one aperture 716. The first polysilicon layer 718 may be doped with a suitable dopant such as, for example, arsenic (As), antimony (Sb), phosphorous (P) and boron (B), among others.

A hemispherical silicon grain layer (HSG) 720 or a rough polysilicon layer may optionally be formed over the first polysilicon layer 718 to increase the surface area thereof. The hemispherical silicon grain layer 720 may be formed, for example, by depositing an amorphous silicon layer and than annealing it to form a rough surface thereon. The hemispherical silicon grain layer 720 may optionally by doped.

The first polysilicon layer 718 and the hemispherical silicon grain layer (HSG) 720 are patterned and etched to form a crown structure 730. Both the first polysilicon layer 718 and the hemispherical silicon grain layer (HSG) act as a first electrode for the crown capacitor.

The crown capacitor further includes an insulating layer 732 formed over the hemispherical silicon grain layer 718 of the crown structure 730. The insulating layer 732 preferably comprises a high dielectric constant material (dielectric constant greater then about 10). High dielectric constant materials advantageously permit higher charge storage capacities for the capacitor structures. Suitable dielectric materials may include for example, tantalum pentoxide ($Ta_2O_5$), silicon oxide/silicon nitride/oxynitride (ONO), aluminum oxide ($Al_2O_3$), barium strontium titanate (BST), barium titanate, lead zirconate titanate (PZT), lead lanthanium titanate, strontium titanate and strontium bismuth titanate, among others.

Referring to FIG. 10B, an integrated barrier layer 734 is formed on the insulating layer 732. The integrated barrier layer 734 comprises a titanium nitride (TiN) layer formed with a chemical vapor deposition (CVD) process and a tungsten (W) layer formed with a cyclical deposition process. The integrated barrier layer 734 is formed using the deposition techniques described above with respect to FIGS. 4-6. The thickness of the integrated barrier layer 734 is typically about 20 Å to about 500 Å.

A metal layer 742 is formed over the integrated barrier layer 734. The metal layer 742 comprises the second electrode of the crown capacitor. A suitable metal for the metal layer 742 includes, for example, tungsten (W). The thickness of the metal layer 742 is typically about 100 Å to about 1000 Å.

After the metal layer 742 is formed, the crown capacitor is completed by depositing, for example, a second polysilicon layer 752 thereover, as shown in FIG. 10B. The second polysilicon layer 752 may be formed using conventional deposition techniques. For example, the second polysilicon layer 752 may be deposited using a chemical vapor deposition (CVD) process in which silane ($SiH_4$) is thermally decomposed to form polysilicon at a temperature between about 550° C. and 700° C.

While the foregoing is directed to the preferred embodiment of the present invention, other and further embodiments of the invention may be devised without departing from the basic scope thereof, and the scope thereof is determined by the claims that follow.

What is claimed is:

1. A method for forming an integrated barrier material on a substrate, comprising:
    positioning a substrate within a process chamber;
    forming an integrated barrier layer on the substrate by a cyclical deposition process and a chemical vapor deposition process, wherein the integrated barrier layer comprises tungsten nitride deposited by the cyclical deposition process; and
    depositing a tungsten metallization layer over the integrated barrier layer during a thermal chemical vapor deposition process, wherein the substrate is sequentially exposed to tungsten hexafluoride and ammonia during the cyclical deposition process.

2. A method for forming an integrated barrier material on a substrate, comprising:
    positioning a substrate within a process chamber;
    forming an integrated barrier layer on the substrate by a cyclical deposition process and a chemical vapor deposition process, wherein the integrated barrier layer comprises metallic tungsten deposited by the cyclical deposition process; and
    depositing a tungsten metallization layer over the integrated barrier layer during a thermal chemical vapor deposition process, wherein the substrate is sequentially exposed to tungsten hexafluoride and a reducing gas during the cyclical deposition process.

3. The method of claim 2, wherein the reducing gas comprises a reducing agent selected from the group consisting of silane, disilane, and diborane.

* * * * *

UNITED STATES PATENT AND TRADEMARK OFFICE
CERTIFICATE OF CORRECTION

PATENT NO. : 7,867,914 B2  Page 1 of 1
APPLICATION NO. : 11/770735
DATED : January 11, 2011
INVENTOR(S) : Xi et al.

It is certified that error appears in the above-identified patent and that said Letters Patent is hereby corrected as shown below:

Column 10, Line 21, please delete "scorn" and insert --sccm-- therefor.

Signed and Sealed this
Fifth Day of April, 2011

David J. Kappos
*Director of the United States Patent and Trademark Office*